(12) United States Patent
Vakilinia et al.

(10) Patent No.: US 9,250,994 B1
(45) Date of Patent: Feb. 2, 2016

(54) NON-BINARY LOW-DENSITY PARITY CHECK (LDPC) DECODING USING TRELLIS MAXIMIZATION

(71) Applicant: Western Digital Technologies, Inc., Irvine, CA (US)

(72) Inventors: Kasra Vakilinia, Los Angeles, CA (US); Anantha Raman Krishnan, Irvine, CA (US); Majid Nemati Anaraki, Irvine, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 3 days.

(21) Appl. No.: 14/231,531

(22) Filed: Mar. 31, 2014

Related U.S. Application Data

(60) Provisional application No. 61/936,277, filed on Feb. 5, 2014.

(51) Int. Cl.
*H03M 13/00* (2006.01)
*G06F 11/10* (2006.01)
*H03M 13/11* (2006.01)
*H03M 13/25* (2006.01)

(52) U.S. Cl.
CPC ....... *G06F 11/1008* (2013.01); *H03M 13/1117* (2013.01); *H03M 13/255* (2013.01)

(58) Field of Classification Search
CPC .......... G06F 11/1008; H03M 13/1117; H03M 13/225
See application file for complete search history.

(56) References Cited

U.S. PATENT DOCUMENTS

| 6,163,581 | A  | * | 12/2000 | Kang ........................... 375/341 |
| 6,856,556 | B1 |   | 2/2005  | Hajeck |
| 7,126,857 | B2 |   | 10/2006 | Hajeck |
| 7,430,136 | B2 |   | 9/2008  | Merry, Jr. et al. |
| 7,447,807 | B1 |   | 11/2008 | Merry et al. |
| 7,502,256 | B2 |   | 3/2009  | Merry, Jr. et al. |
| 7,509,441 | B1 |   | 3/2009  | Merry et al. |
| 7,596,643 | B2 |   | 9/2009  | Merry, Jr. et al. |
| 7,653,778 | B2 |   | 1/2010  | Merry, Jr. et al. |
| 7,685,337 | B2 |   | 3/2010  | Merry, Jr. et al. |
| 7,685,338 | B2 |   | 3/2010  | Merry, Jr. et al. |

(Continued)

OTHER PUBLICATIONS

Declercq, D.; Fossorier, M., "Decoding Algorithms for Nonbinary LDPC Codes Over GF ," Communications, IEEE Transactions on , vol. 55, No. 4, pp. 633,643, Apr. 2007.

(Continued)

*Primary Examiner* — Esaw Abraham
(74) *Attorney, Agent, or Firm* — McDermott Will & Emery LLP

(57) ABSTRACT

Data storage systems may include a solid-state memory array configured to store encoded data units and a controller configured to decode the encoded data units. Decoding the encoded data units may include updating a check node of a plurality of check nodes associated with a parity check matrix by identifying first and second sets of variable nodes in a plurality of variable nodes associated in the parity check matrix with the check node and constructing a trellis based on the second set of variable nodes. The trellis may be used to determine a message and, based at least in part on the message, a first set of messages to be sent from the check node to the first set of variable nodes may be determined. A second set of messages to be sent from the check node to each variable node in the second set of variable nodes also may be determined.

27 Claims, 14 Drawing Sheets

(56) References Cited

U.S. PATENT DOCUMENTS

| | | | |
|---|---|---|---|
| 7,685,374 B2 | 3/2010 | Diggs et al. | |
| 7,733,712 B1 | 6/2010 | Walston et al. | |
| 7,765,373 B1 | 7/2010 | Merry et al. | |
| 7,898,855 B2 | 3/2011 | Merry, Jr. et al. | |
| 7,912,991 B1 | 3/2011 | Merry et al. | |
| 7,936,603 B2 | 5/2011 | Merry, Jr. et al. | |
| 7,962,792 B2 | 6/2011 | Diggs et al. | |
| 8,028,216 B1 * | 9/2011 | Yeo et al. | 714/755 |
| 8,078,918 B2 | 12/2011 | Diggs et al. | |
| 8,090,899 B1 | 1/2012 | Syu | |
| 8,095,851 B2 | 1/2012 | Diggs et al. | |
| 8,108,692 B1 | 1/2012 | Merry et al. | |
| 8,122,185 B2 | 2/2012 | Merry, Jr. et al. | |
| 8,127,048 B1 | 2/2012 | Merry et al. | |
| 8,135,903 B1 | 3/2012 | Kan | |
| 8,151,020 B2 | 4/2012 | Merry, Jr. et al. | |
| 8,161,227 B1 | 4/2012 | Diggs et al. | |
| 8,166,245 B2 | 4/2012 | Diggs et al. | |
| 8,181,081 B1 * | 5/2012 | Yeo et al. | 714/752 |
| 8,243,525 B1 | 8/2012 | Kan | |
| 8,254,172 B1 | 8/2012 | Kan | |
| 8,261,012 B2 | 9/2012 | Kan | |
| 8,296,625 B2 | 10/2012 | Diggs et al. | |
| 8,312,207 B2 | 11/2012 | Merry, Jr. et al. | |
| 8,316,176 B1 | 11/2012 | Phan et al. | |
| 8,341,339 B1 | 12/2012 | Boyle et al. | |
| 8,375,151 B1 | 2/2013 | Kan | |
| 8,392,635 B2 | 3/2013 | Booth et al. | |
| 8,397,107 B1 | 3/2013 | Syu et al. | |
| 8,407,449 B1 | 3/2013 | Colon et al. | |
| 8,423,722 B1 | 4/2013 | Deforest et al. | |
| 8,433,858 B1 | 4/2013 | Diggs et al. | |
| 8,443,167 B1 | 5/2013 | Fallone et al. | |
| 8,447,920 B1 | 5/2013 | Syu | |
| 8,458,435 B1 | 6/2013 | Rainey, III et al. | |
| 8,458,556 B2 | 6/2013 | Planjery et al. | |
| 8,478,930 B1 | 7/2013 | Syu | |
| 8,489,854 B1 | 7/2013 | Colon et al. | |
| 8,503,237 B1 | 8/2013 | Horn | |
| 8,521,972 B1 | 8/2013 | Boyle et al. | |
| 8,549,236 B2 | 10/2013 | Diggs et al. | |
| 8,559,540 B2 | 10/2013 | Sun et al. | |
| 8,583,835 B1 | 11/2013 | Kan | |
| 8,595,590 B1 * | 11/2013 | Vojcic et al. | 714/758 |
| 8,601,311 B2 | 12/2013 | Horn | |
| 8,601,313 B1 | 12/2013 | Horn | |
| 8,612,669 B1 | 12/2013 | Syu et al. | |
| 8,612,804 B1 | 12/2013 | Kang et al. | |
| 8,615,681 B2 | 12/2013 | Horn | |
| 8,638,602 B1 | 1/2014 | Horn | |
| 8,639,872 B1 | 1/2014 | Boyle et al. | |
| 8,667,361 B1 * | 3/2014 | Varnica et al. | 714/752 |
| 8,683,113 B2 | 3/2014 | Abasto et al. | |
| 8,700,834 B2 | 4/2014 | Horn et al. | |
| 8,700,950 B1 | 4/2014 | Syu | |
| 8,700,951 B1 | 4/2014 | Call et al. | |
| 8,706,792 B1 * | 4/2014 | Moon | 708/531 |
| 8,706,985 B1 | 4/2014 | Boyle et al. | |
| 8,707,104 B1 | 4/2014 | Jean | |
| 8,713,066 B1 | 4/2014 | Lo et al. | |
| 8,713,357 B1 | 4/2014 | Jean et al. | |
| 8,719,531 B2 | 5/2014 | Strange et al. | |
| 8,724,422 B1 | 5/2014 | Agness et al. | |
| 8,725,931 B1 | 5/2014 | Kang | |
| 8,745,277 B2 | 6/2014 | Kan | |
| 8,751,728 B1 | 6/2014 | Syu et al. | |
| 8,769,190 B1 | 7/2014 | Syu et al. | |
| 8,769,232 B2 | 7/2014 | Suryabudi et al. | |
| 8,775,720 B1 | 7/2014 | Meyer et al. | |
| 8,782,327 B1 | 7/2014 | Kang et al. | |
| 8,788,778 B1 | 7/2014 | Boyle | |
| 8,788,779 B1 | 7/2014 | Horn | |
| 8,788,880 B1 | 7/2014 | Gosla et al. | |
| 8,793,429 B1 | 7/2014 | Call et al. | |
| 2010/0174849 A1 | 7/2010 | Walston et al. | |
| 2010/0250793 A1 | 9/2010 | Syu | |
| 2011/0087946 A1 | 4/2011 | Planjery et al. | |
| 2011/0099323 A1 | 4/2011 | Syu | |
| 2011/0283049 A1 | 11/2011 | Kang et al. | |
| 2012/0260020 A1 | 10/2012 | Suryabudi et al. | |
| 2012/0278531 A1 | 11/2012 | Horn | |
| 2012/0284460 A1 | 11/2012 | Guda | |
| 2012/0324191 A1 | 12/2012 | Strange et al. | |
| 2013/0132638 A1 | 5/2013 | Horn et al. | |
| 2013/0145106 A1 | 6/2013 | Kan | |
| 2013/0290793 A1 | 10/2013 | Booth et al. | |
| 2014/0059405 A1 | 2/2014 | Syu et al. | |
| 2014/0101369 A1 | 4/2014 | Tomlin et al. | |
| 2014/0115427 A1 | 4/2014 | Lu | |
| 2014/0133220 A1 | 5/2014 | Danilak et al. | |
| 2014/0136753 A1 | 5/2014 | Tomlin et al. | |
| 2014/0149826 A1 | 5/2014 | Lu et al. | |
| 2014/0157078 A1 | 6/2014 | Danilak et al. | |
| 2014/0181432 A1 | 6/2014 | Horn | |
| 2014/0223255 A1 | 8/2014 | Lu et al. | |

OTHER PUBLICATIONS

Declercq, D. and Fossorier, M. "Extended minsum algorithm for decoding LDPC codes over $GF(q)$", IEEE Int. Symp. Inf. Theory, 2005.

Hongzin Song; Cruz, J.R., "Reduced-complexity decoding of Q-ary LDPC codes for magnetic recording," Magnetics, IEEE Transactions on , vol. 39, No. 2, pp. 1081,1087, Mar. 2003.

Voicila, A.; Declercq, D.; Verdier, F.; Fossorier, M.; Urard, P., "Low-complexity decoding for non-binary LDPC codes in high order fields," Communications, IEEE Transactions on , vol. 58, No. 5, pp. 1365,1375, May 2010.

Voicila, A.; Declercq, D.; Verdier, F.; Fossorier, M.; Urard, P., "Low-Complexity, Low-Memory EMS Algorithm for Non-Binary LDPC Codes," Communications, 2007. ICC '07. IEEE International Conference on , vol., no., pp. 671,676, Jun. 24-28, 2007.

Wymeersch, H., Steendam, H. and Moeneclaey, M. "Log-domain decoding of LDPC codes over GF(q)", Proc. IEEE Int. Conf. Commun., pp. 772-776 2004.

Savin, V. "Min-max decoding for non binary LDPC codes", IEEE Int. Symp. Inf. Theory, 2008.

Kasra Vakilinia, et al., U.S. Appl. No. 14/231,511, filed Mar. 31, 2014, 30 pgs.

* cited by examiner

NON-BINARY LOW-DENSITY PARITY CHECK (LDPC) DECODING USING TRELLIS MAXIMIZATION

CROSS REFERENCE TO RELATED APPLICATIONS

This application claims benefit under 35 U.S.C. §119(e) to U.S. Provisional Patent Application No. 61/936,277 entitled "NON-BINARY LOW-DENSITY PARITY-CHECK (LDPC) DECODING USING TRELLIS MAXIMIZATION" filed on Feb. 5, 2014, the disclosure of which is hereby incorporated by reference in its entirety.

BACKGROUND

1. Technical Field

This disclosure relates electronic systems, such as data storage system. More particularly, the disclosure relates to non-binary low-density parity check (LDPC) decoders and decoding processes that use Trellis Maximization.

2. Description of the Related Art

Non-volatile memory arrays often have limited endurance. The endurance of the memory array is typically contingent on usage pattern and wear. In addition, the endurance depends on a type of the non-volatile memory array used. For example, memory arrays with multi-level cell (MLC) NAND media typically have a lower endurance than memory arrays with single-level cell (SLC) NAND media. To protect user data stored to memory arrays from corruption, which may be caused by a diminished endurance, user data can be encoded, for example, by generating parity data that can be stored along with user data to facilitate error detection and correction. However, retrieval of encoded data can be time consuming and resource intensive. Accordingly, it is desirable to provide more efficient mechanisms for decoding data.

BRIEF DESCRIPTION OF THE DRAWINGS

Systems and methods disclosed herein will now be described with reference to the following drawings, in which:

FIGS. 5A-5C illustrate an example of a decoding process according to some embodiments of the invention.

DETAILED DESCRIPTION

Figure 1A:
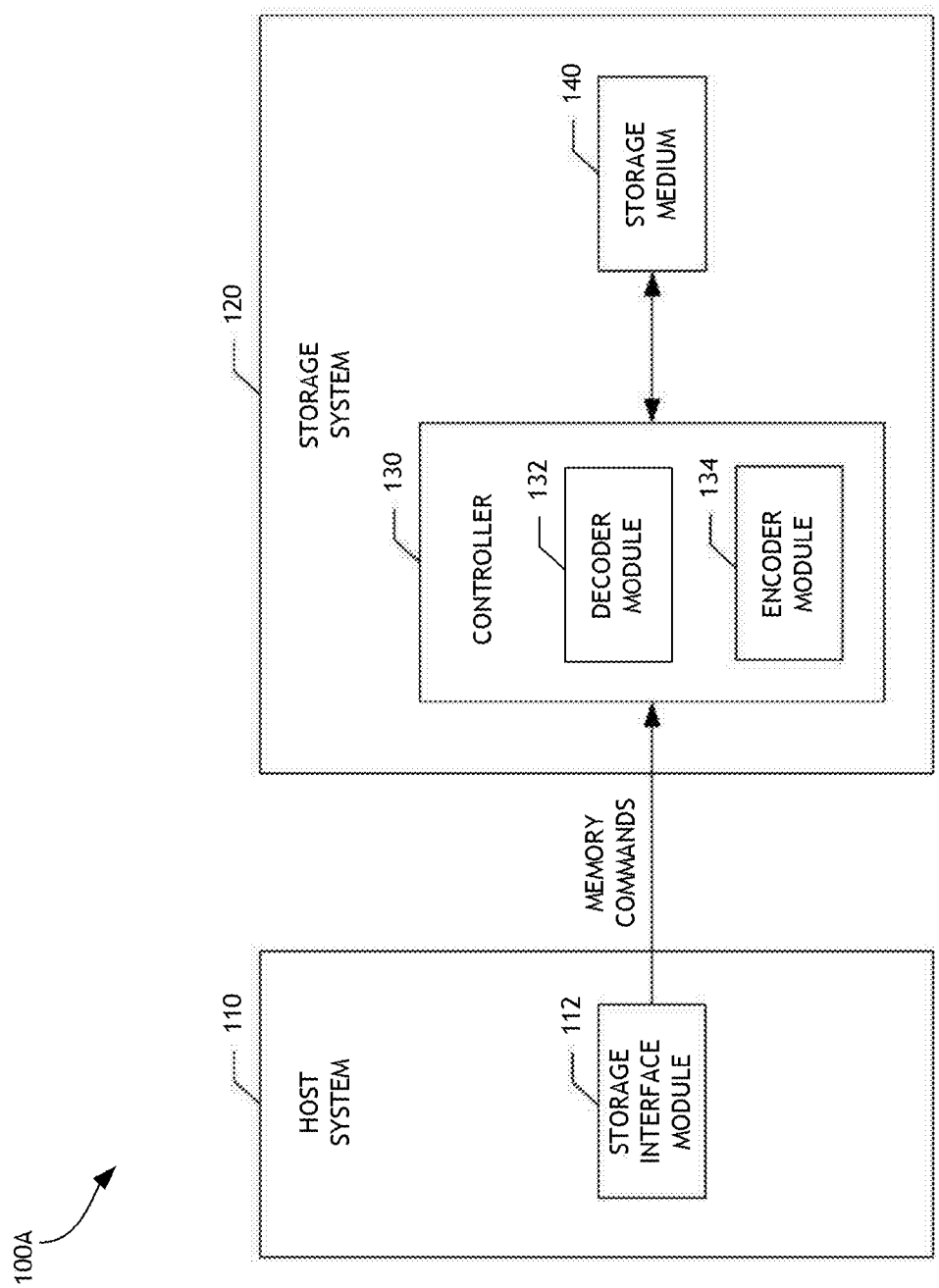
FIG. 1A illustrates a combination of a host system and a data storage system that implements a non-binary decoder that uses Trellis Maximization according to some embodiments of the invention.

While certain embodiments are described, these embodiments are presented by way of example only, and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

Overview

Data storage systems, such as solid state drives, typically include one or more controllers coupled with one or more non-volatile memory arrays. Depending on the type of non-volatile memory array used, stored data may be subject to corruption as a result of, for example, read/write disturbs, loss of data retention, and loss of endurance. Data storage systems can utilize one or more error correction and error coding mechanisms to detect and correct errors in the stored data. One such mechanism can determine parity data when writing user data. Parity data can be stored, for example, in a memory array. When stored user data is retrieved, parity data can be utilized as part of a decoding process to determine the integrity of the retrieved user data. If one or more errors are detected, such errors may be corrected.

One type of error correction or error coding mechanism that can be used by data storage systems to code data is low-density parity check (LDPC) codes. To manage LDPC coding, the data storage systems can include encoder and decoder modules that utilize the LDPC codes for decoding and generating parity data, respectively. LDPC codes can be decoded using a decoding matrix H and generated using a corresponding generating matrix G. In some embodiments, the decoding process performed by the decoder module can involve an iterative decoding process where values (for example, probabilities or likelihoods of belief) are passed between variable nodes and check nodes to decode data.

Data storage systems can implement binary and non-binary LDPC codes. In some embodiments, whether the data storage systems may decode or encode data using a binary LDPC code or non-binary LDPC code can, for example, depend on a number of memory states for a storage medium in which the data storage systems can store and retrieve data, whether multiple memory cells are grouped into a memory element, etc. For example, a data storage system can use binary LDPC codes for storing or retrieving data from one or more storage mediums including memory elements that store single bits of information, such as SLC NAND media which stores in a memory cell one of "0" and "1" values. A data storage system can use non-binary LDPC codes for storing or retrieving data from one or more storage mediums including memory elements that store multiple bits of information, such as MLC NAND media, SLC NAND media in which two or more memory cells are grouped into a single memory element, etc. For example, two-level or two-bit MLC NAND can store in a memory cell one of "00," "01," "10," and "11" values.

Embodiments of the present disclosure are directed in part to a decoders and decoding processes that efficiently performs non-binary LDPC decoding. Such decoders and decoding processes can decode non-binary LDPC codes quickly and efficiently while utilizing little memory resources. In some embodiments, a check node update can be performed efficiently using Trellis Maximization (Trellis-Max) operation that generates and utilizes for decoding one or more trellises, such as Viterbi trellises. Disclosed decoders and decoding processes can perform decoding effectively with high speeds and low memory consumption. In addition, such decoders and decoding processes can operate effectively, particularly on channels having high signal-to-noise ratio (SNR) as well as in implementations that utilize limited precision for representing and storing data values. Further, as is explained below, such decoders can be easily implemented in hardware as operations required for implementing the decoding are limited to binary additions, limited precision subtractions, simple multiplications by a factor (which can be performed by bit shifters), and comparisons.

Disclosed decoders and decoding processes can be used in applications where data is transmitted over an unreliable (e.g., noisy) channel or where such transmission model is applicable. For example, disclosed embodiments can be used in data storage systems, such as solid-state drives, that store data in memory which may be prone to data corruption. Hence, the process of storing and retrieving data can be likened to a transmission over an unreliable channel. As another example, disclosed embodiments can be utilized in communications systems, such as mobile and wireless transmission systems. As yet another example, disclosed embodiments can be utilized in speech recognition systems.

System Overview

FIG. 1A illustrates a combination 100A of a host system 110 and a data storage system 120 that implements a non-binary decoder that uses Trellis Maximization according to some embodiments. As is shown, the data storage system 120 (e.g., hybrid hard drive, solid state drive, etc.) includes a controller 130 and a storage medium 140. The storage medium 140 may comprise an array of non-volatile memory, such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NAND memory (e.g., single-level cell (SLC) memory, multi-level cell (MLC) memory, or any combination thereof), NOR memory, EEPROM, Ferroelectric Memory (FeRAM), Magnetoresistive RAM (MRAM), other discrete NVM (non-volatile memory) chips, or any combination thereof. Non-volatile memory can be arranged in blocks having one or more pages, which comprise one or more memory cells. In some embodiments, the data storage system 120 can further comprise other types of storage, such as one or more magnetic media storage modules or other types of storage modules.

The controller 130 can be configured to receive data and storage access commands from a storage interface module 112 (e.g., a device driver) of the host system 110. Storage access commands communicated by the storage interface module 112 can include write data and read data commands issued by the host system 110. Read and write commands can specify a logical address (e.g., logical block addresses or LBAs) used to access the data storage system 120. The controller 130 can execute the received commands in the storage medium 140.

Data storage system 120 can store data communicated by the host system 110. In other words, the data storage system 120 can act as memory storage for the host system 110. To facilitate this function, the controller 130 can implement a logical interface. The logical interface can present to the host system 110 data storage system memory as a set of logical addresses (e.g., contiguous address) where user data can be stored. Internally, the controller 130 can map logical addresses to various physical locations or addresses in the storage medium 140 and other storage modules.

The controller 130 includes a decoder module 132 and an encoder module 134 configured to decode and encode data, respectively, stored in and retrieved from the storage medium 140. The encoder module 134 can encode stored data so as to protect the data from potential errors encountered during retrieval of stored data. The decoder module 132 can further perform error detection to determine integrity of data retrieved from the storage medium 140 and perform, if necessary, error correction of retrieved data. In some embodiments, when the storage medium 140 is comprises NAND memory that is early in its lifecycle and thus has relatively higher retention and endurance, the controller 130 can direct the encoder module 134 to encode data using a relatively higher coding rate so that less parity data is used. As the storage medium 140 wears out over time, the controller 130 can direct the encoder module 134 to switch to lower encoding rates such that more parity data is generated to protect stored user data from errors. The controller 130 can store the coding rates for encoded data in the storage medium 140 or another storage module (not shown) so that the decoder module 132 can later access the information to decode the encoded data. In some embodiments, the decoder module 132 and the encoder module 134 can respectively decode LDPC coded data and encode data using LDPC codes.

Figure 1B:
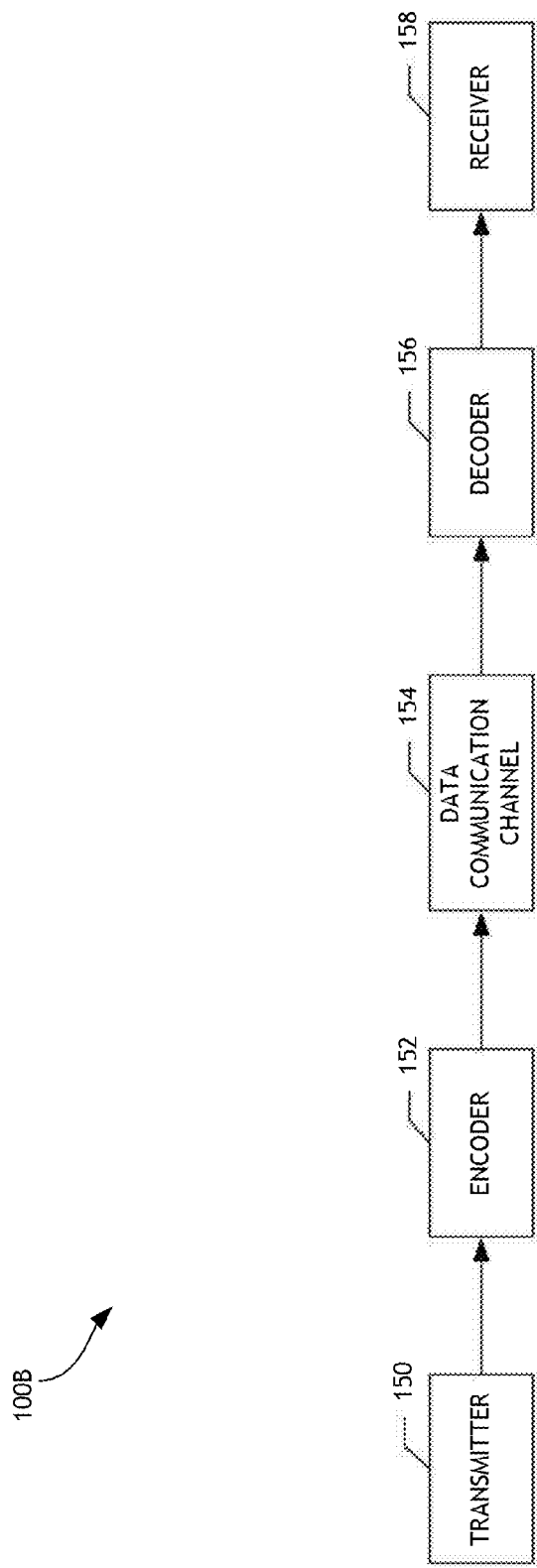
FIG. 1B illustrates a data transmission system according to some embodiments of the invention.

FIG. 1B illustrates a data transmission system 100B according to some embodiments. In the illustrated embodiment, a transmitter 150 sends or transmits data to a receiver 158 over a data communication channel 154. Transmitted data is encoded by an encoder 152 before the data is transmitted over the data communication channel 154. Data communication channel 154 can be any suitable wired and/or wireless connection, such as a satellite channel, 802.11 wireless channel, Ethernet channel, Bluetooth channel, connection between semiconductor components or devices, data storage device (e.g., magnetic, solid-state, etc.), and so on. Data transmitted over the data communication channel 154 is decoded by a decoder 156. Decoded data is then provided to the receiver 158.

LDPC Decoder

Figure 2:
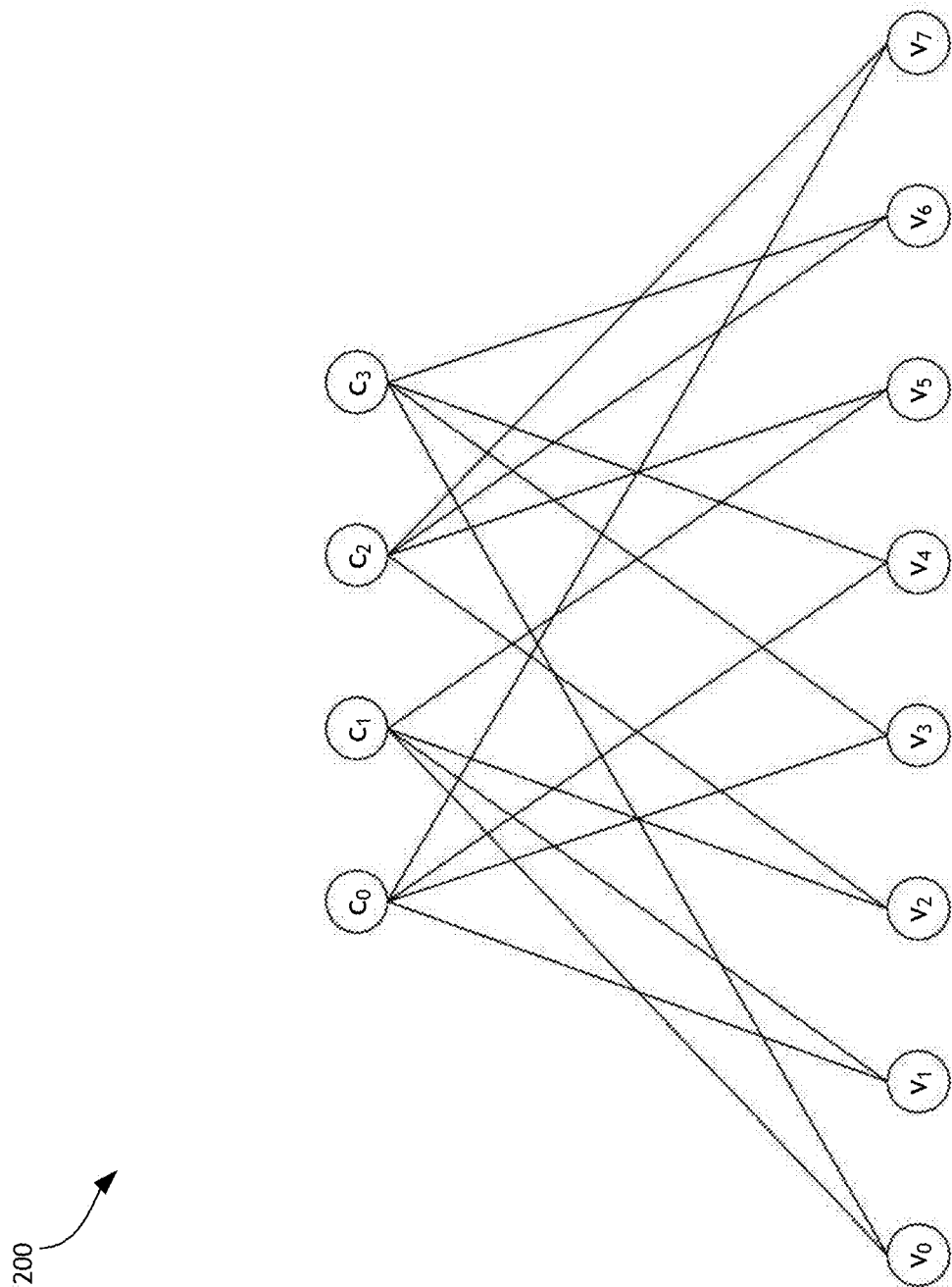
FIG. 2 illustrates a diagram depicting a decoding process performed by a decoder according to some embodiments of the invention.

FIG. 2 illustrates a diagram depicting a decoding process 200 performed by a decoder, such as the decoder module 132 or the decoder 156, according to some embodiments. In some embodiments, the process 200 performs LDPC decoding using, for example, the following parity check matrix, H having dimensions (n, m):

$$\begin{bmatrix} 0 & 1 & 0 & 1 & 1 & 0 & 0 & 1 \\ 1 & 1 & 1 & 0 & 0 & 1 & 0 & 0 \\ 0 & 0 & 1 & 0 & 0 & 1 & 1 & 1 \\ 1 & 0 & 0 & 1 & 1 & 0 & 1 & 0 \end{bmatrix}$$

The above matrix H has dimensions (n, m)=(8, 4) and is a sparse matrix. The dimension n can correspond to the number of bits or symbols in a code word (e.g., code word length) and dimension m can correspond to the number of parity bits or symbols. Any suitable parity check matrix can be used, such as any suitable sparse matrix having suitable dimensions that satisfy requirements of a particular channel.

FIG. 2 illustrates a Tanner graph corresponding to the above parity check matrix H. In the illustrated embodiment, the parity bits or symbols in the H matrix (dimension m) are represented as check nodes c (e.g., four check nodes) and bits or symbols in a code word (dimension n) are represented as variable nodes v (e.g., eight variable nodes). For example, an edge connects a given variable node j to a given check node i provided that the element $h_{ij}$ of matrix H is 1. In some embodiments, LDPC decoding can be performed iteratively by passing messages between variable nodes and check nodes, determining responses by check nodes (e.g., performing check node updates), and passing response messages from check nodes to variable nodes. The iterative process can be performed until received (or retrieved) data has been corrected. For example, the iterative process can be terminated when it has been determined that the parity check associated with the parity matrix H has been satisfied. The process 200 is applicable to binary LDPC decoding, in which binary messages are passed between variable nodes and check nodes, and to non-binary LDPC decoding, in which non-binary messages are passed between variable nodes and check nodes. Non-binary LDPC decoding presents a more complex, time and resource intensive problem than binary LDPC decoding.

In some embodiments, the decoder module 132 (or decoder 156) can decode data that may have been encoded using a non-binary LDPC coding. In data storage system application, for example, the decoder module 132 can read retrieved data from the storage medium 140 and calculate (or utilize pre-calculated) log-likelihood ratio (LLR) values, such as vectors of LLR values, to decode the retrieved data. In some embodiments, the decoder module 132 performs soft-decision decoding using the LLR values or any other suitable statistical or probability metrics. In other embodiments, the decoder module 132 can perform hard-decision decoding.

Figure 3:
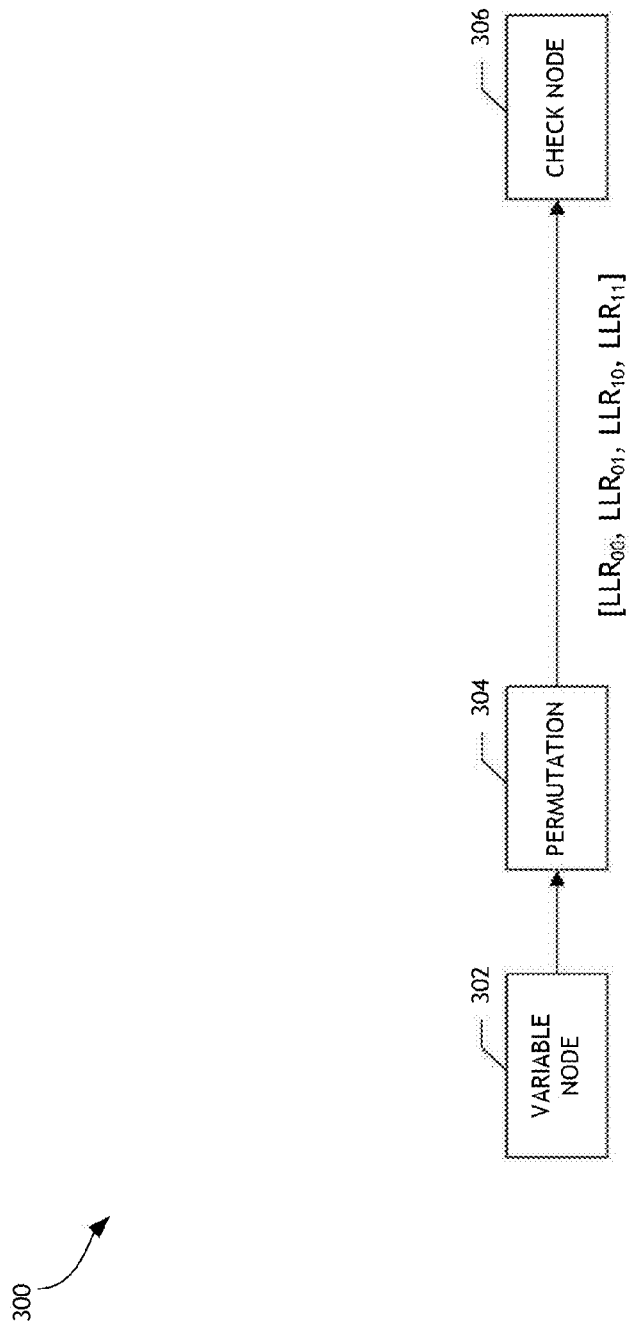
FIG. 3 illustrates a diagram depicting a decoding process performed by a decoder according to some embodiments of the invention.

Non-binary LDPC decoding can involve iterative transfers of messages between variable nodes and check nodes. FIG. 3 illustrates a diagram 300 depicting a decoding process performed by a decoder, such as the decoder module 132 or decoder 156, according to some embodiments. Diagram 300 can correspond to one edge in diagram 200 of FIG. 2. As is illustrated, messages are passed from a variable node 302 to a check node 306. In addition, return messages (not illustrated) can be passed from the check node 306 to the variable node 302. Messages passed to the check nodes can be permuted by a permutation node 304 by a corresponding element in the parity matrix H. In certain embodiments, a check node update operation can encompass passing messages from variable nodes to a check node to which the variable nodes are connected, determining return messages for connected variable nodes, and receiving return messages back from the check node. In some embodiments, the diagram 300 illustrates non-binary LDPC decoding (e.g., non-binary messages are passed between variable nodes and check nodes). As is illustrated, vectors with LLR values can be permuted and passed as messages to the check node 306. The illustrated vector in FIG. 3 can be associated with values stored in a two-level MLC NAND memory cell (e.g., log-likelihood ratios of "00," "01," "10," and "11" symbols).

In some embodiments, efficiency of decoding is improved. A set of variable nodes for which computationally intensive determination of messages to be sent back from check nodes can be reduced. For example, a subset of variable nodes can be selected based on one or more metrics. In some embodiments, the subset of variable nodes is selected based on a reliability metric of the variable nodes. One or more variable nodes can be determined to be unreliable, such as by comparing the reliability metrics associated with the variable nodes to a one or more reliability thresholds. The one or more unreliable variable nodes can be grouped into the subset for which more computationally intensive decoding is performed. For the remaining variable nodes (which are deemed to be more reliable), less computationally intensive decoding is performed. This approach can be more efficient than traditional non-binary decoding because the subset for which more computationally intensive decoding is performed may include smaller number of variable nodes than the entire set of variable nodes.

In some embodiments, each message, such as log-likelihood ratio (LLR) vector of size q, from variable nodes to check nodes can be normalized (e.g., divided) by the largest value and permuted by the corresponding element of the parity check matrix H. The normalization is a simple subtraction in logarithmic (or log) domain. After normalization, one of the elements in the vector becomes zero (e.g., the element corresponding to the largest value) and the remaining elements become negative. Based on a comparison using the second maximum value of each LLR vector from each permutation node, the set of variable nodes connected to a check node (e.g., set of size $d_c$) is can be divided into two subsets: VITERBI-SET and VITERBI-SET-COMPLEMENT of sizes VS and VSC respectively (VS+VSC=$d_c$). The two subsets can be mutually exclusive. In some embodiments, VS and VSC can be any suitable integer number. In some embodiments, processing of these two subsets (e.g., determining messages to be sent to the variable nodes of the two subsets) constitutes performing check node updates.

In some embodiments, variable nodes assigned to VITERBI-SET can be variable nodes with small differences between their largest LLR values (e.g., 0 if normalized) and second largest LLR values (e.g., largest negative number if normalized). Variable nodes assigned to VITERBI-SET can be considered to be less reliable or unreliable (e.g., due to having unreliable information for decoding the message), and such variable nodes can be identified by comparing the difference between the largest and second largest LLR values to a reliability threshold. Variable nodes with large differences between their largest LLR values and second largest LLR values can be assigned to VITERBI-SET-COMPLEMENT. Variable nodes assigned to VITERBI-SET-COMPLEMENT can be considered to be reliable (e.g., due to having reliable information for decoding the message), and such variable nodes can be identified by comparing the difference between the largest and second largest LLR values to a reliability threshold, which can be the same or different threshold as the threshold used for identifying members of VITERBI-SET. In some embodiments, assignment of variable nodes assigned to the sets VITERBI-SET and VITERBI-SET-COMPLEMENT can be performed separately while performing separate decoding iterations. For example, suppose that on the first decoding iteration 5 variable nodes are assigned to VITERBI-SET and 15 variable nodes are assigned to VITERBI-SET-COMPLEMENT. On second (or subsequent) iteration, 4 variable nodes can be assigned to VITERBI-SET and 16 variable nodes can be assigned to VITERBI-SET-COMPLEMENT In some embodiments, during performing of a check node update for the elements in VITERBI-SET-COMPLEMENT, only Galois field (GF) element or index of the largest LLR value can be retained. For the elements in VITERBI-SET, Trellis-Maximization operations can be performed as explained below.

Figure 4:
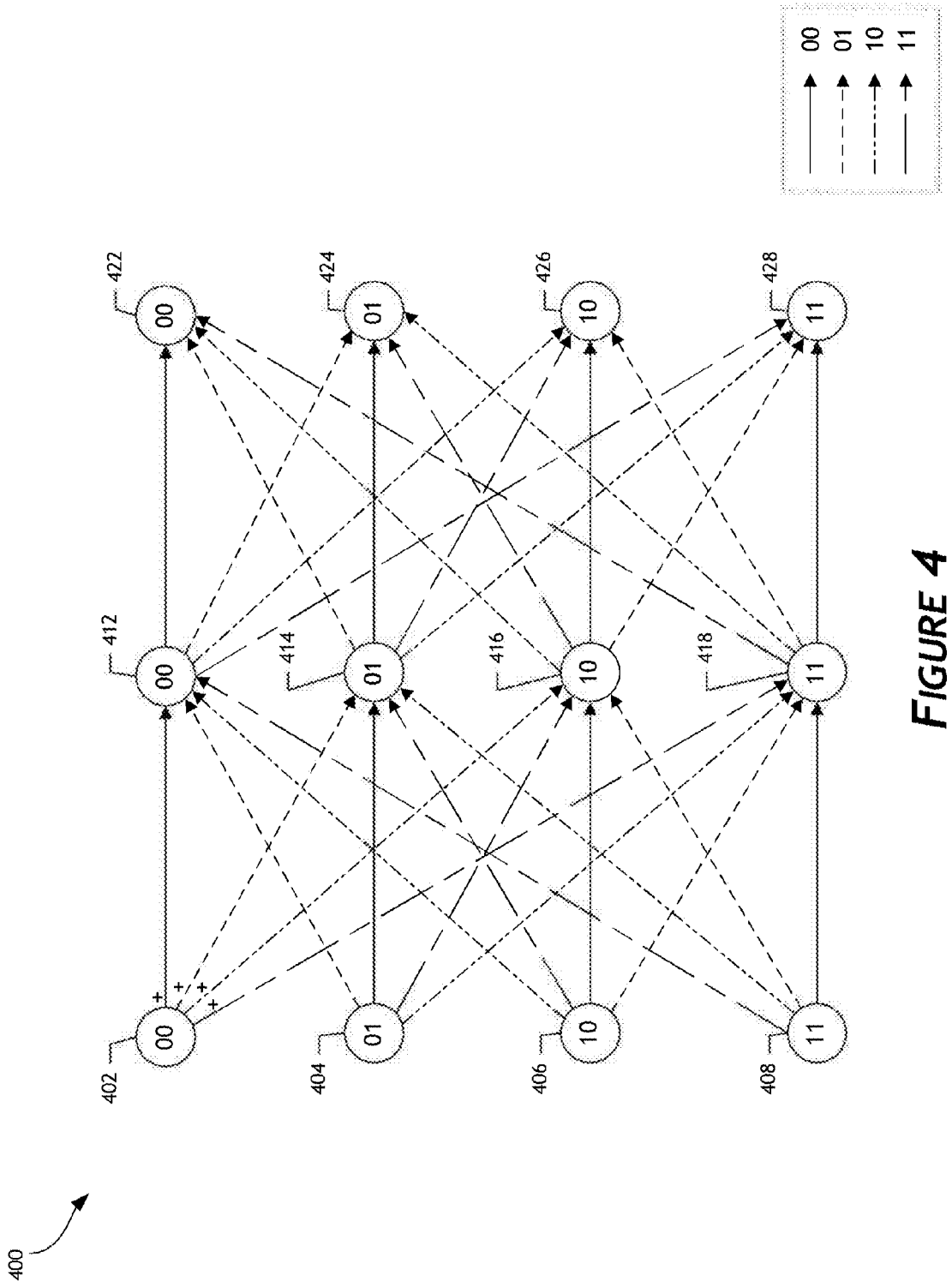
FIG. 4 illustrates a diagram depicting a decoding process that uses Trellis Maximization performed by a decoder according to some embodiments of the invention.

FIG. 4 illustrates a diagram 400 depicting a decoding process that uses Trellis Maximization performed by a decoder, such as the decoder module 132 or decoder 156, according to some embodiments. Diagram 400 illustrates a trellis (e.g., Viterbi trellis) in which trellis nodes 402, 404, 406, and 408 are assigned costs that correspond to the normalized LLR vector (assuming, for example, two-level MLC memory or grouped two or more SLC memory cells) of a first variable node, trellis nodes 412, 414, 416, and 418 are assigned costs that correspond to the normalized LLR vector of a second variable node, trellis nodes 422, 424, 426, and 428 are assigned costs that correspond to the normalized LLR vector of a third variable node. In some embodiments, cost corresponds to a measure of reliability. For example, minimizing the cost can correspond to maximizing reliability. The illustrated trellis can be extended to include other variable nodes in the code word (e.g., the illustrated trellis can have n sections corresponding to the number of symbols in a non-binary code word).

In some embodiments, the diagram 400 is generated by assigning the symbols (e.g., "00," "01," "10," and "11") to the left most nodes (e.g., nodes 402, 404, 406, and 408) and by considering the symbols as transitions for a fully connected trellis. The nodes in the trellis depicted in the diagram 400 can be fully connected by considering transitions between nodes, such as transitions corresponding to the symbols (e.g., "00," "01," "10," "11"). For example, as is illustrated, node 402 corresponds to the symbol "00." The ending node associated with transition "00" from node 402 can be determined by performing GF operation, such as addition. For instance, GF addition between "00" and "00" can correspond to performing exclusive OR (XOR) operation, which results in "00." Accordingly, transition "00" from node 402 ends up at node 412 (which is corresponds to the symbol "00"). Similarly, transition "01" from node 402 ends up at node 414 (which corresponds to the symbol "01"), transition "10" from node 402 ends up at node 416 (which corresponds to the symbol "10"), and transition "11" from node 402 ends up at node 418 (which corresponds to the symbol "11"). As another example, transition "11" from node 414 (which corresponds to the symbol "01") ends up at node 426 (which corresponds to the symbol "10"), as XOR (01, 11) equals to 10. In various embodiments, GF addition can correspond to any suitable operation, not necessarily XOR. In certain embodiments, any suitable GF operation can be used for constructing the trellis.

In some embodiments, check node update process is as follows:
1) Initialize the variable nodes with costs corresponding to LLRs from the channel (e.g., memory storage).
2) Construct the vectors of $[LLR_{00}, LLR_{01}, LLR_{10}, LLR_{11}]$ and normalize them by subtracting the largest value (e.g., division corresponds to subtraction in log domain). For example, assuming $LLR_{01}$ to be the largest value, subtraction results in vector: $[LLR_{00}-LLR_{01}, 0, LLR_{10}-LLR_{01}, LLR_{11}-LLR_{01}]$.
3) Find the second largest value (e.g., largest negative value, which can be smallest absolute value).
4) For each row of the H matrix from 1 to m
   a) Consider $d_c$ connected variable nodes.
   b) Permute each of the $d_c$ vectors based on the values from H matrix (e.g., permute the corresponding indices).
   c) Based on the second largest values construct the subsets VITERBI-SET and VITERBI-SET-COMPLEMENT based on sizes VS and VSC (VS+VSC=$d_c$).
   d) Add up the indices corresponding to the largest value (corresponding to zero when normalized) of each vector in VITERBI-SET-COMPLEMENT and store it in VSC-ELEMENT (or store it as ME).
   e) Perform Trellis-Maximization on the subset VITERBI-SET and record the results in VS-VECTOR.
   f) For each message going back to the elements in VITERBI-SET-COMPLEMENT, send the VS-VECTOR permuted by the VSC-ELEMENT and the GF element corresponding to maximum LLR and inversely permuted by the element in H.
   g) For each message going back to the elements in VITERBI-SET, compute Trellis-Maximization on the remaining elements in set VITERBI-SET and permuted by the VSC-ELEMENT and inversely permuted by the element in H.

Figures 5A, 5B, 5C:
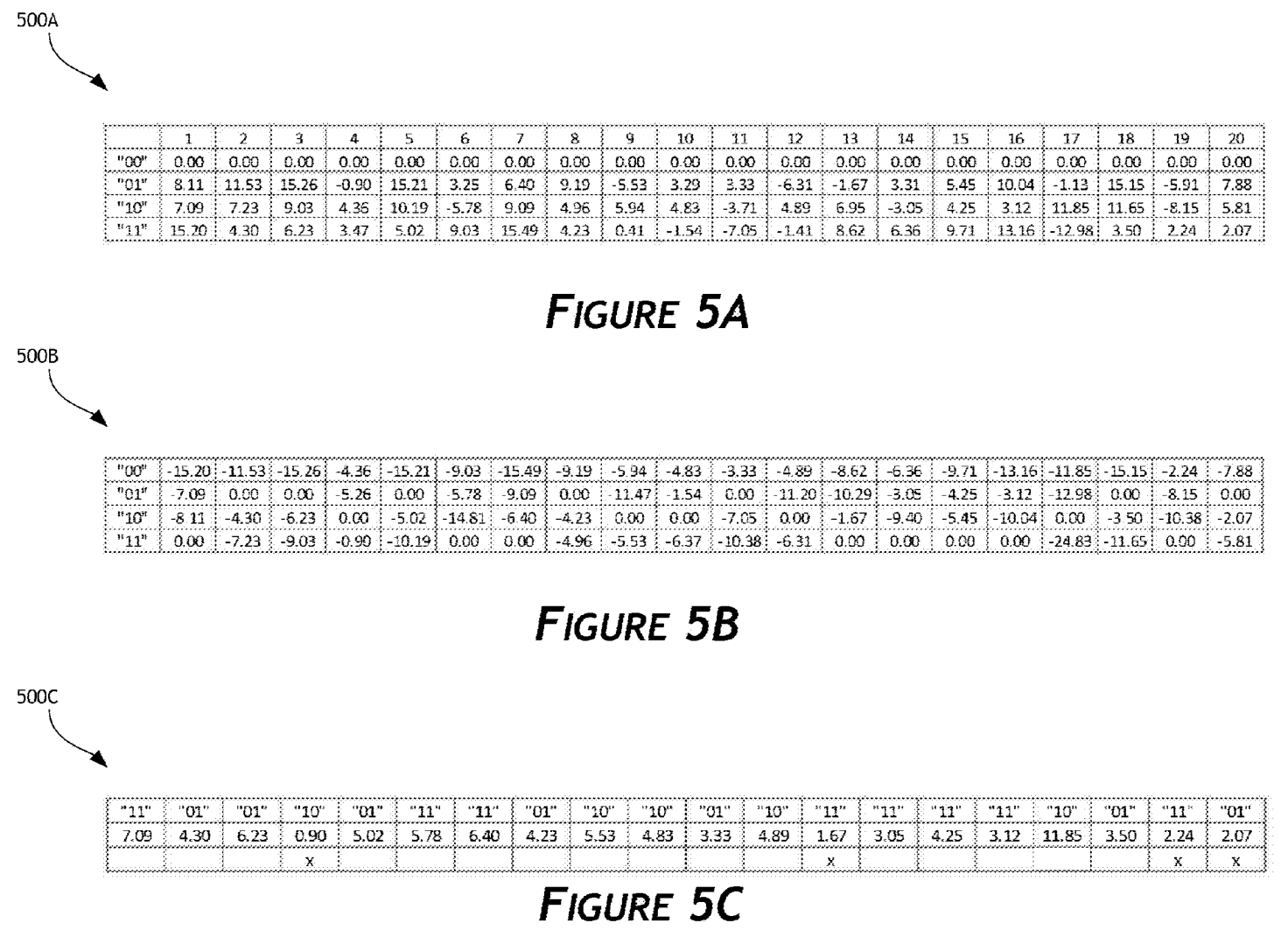

For example, suppose that the parity check matrix H has m check nodes, n variable nodes where the degree of each check node is twenty (e.g., $d_c$=20) over Galois field of size 4 (e.g., GF(4)). In addition, suppose that VS is set as 4 and VSC is set as 16, which means that four of the least reliable messages from variable nodes are included in VITERBI-SET. Further, suppose that the LLR values (which may be permuted) received from the twenty variable nodes connected to a given check node are illustrated in table 500A of FIG. 5A. The columns in table 500A can correspond to the costs assigned to the variable nodes one through twenty. The values in table 500A can be normalized by the largest element in each column. In log domain, the normalization operation is performed as subtraction. Normalized values are illustrated in table 500B of FIG. 5B. For instance, the largest value in column 4 (variable node 4) is 4.36 (corresponding to the symbol "10"). During normalization of column 4, the value 4.36 is subtracted from the values in that column, resulting in the values illustrated in table 500B. Table 500B illustrates normalized LLR vectors corresponding to the costs assigned to the variable nodes.

Continuing with the above example, variable nodes can be separated into VITERBI-SET and VITERBI-SET-COMPLEMENT subsets. Columns containing the largest four negative values (or smallest four absolute values) are selected and designated as least reliable ones. These columns correspond to variable nodes that become part of VITERBI-SET. Referring to table 500B of FIG. 5B, column 4 (having largest negative value of −0.90), column 13 (having largest negative value of −1.67), column 19 (having largest negative value of −2.24), and column 20 (having largest negative value of −2.07) are identified as having largest four negative values, which corresponds to the smallest difference between the first and second largest values. Variable nodes associated with columns 4, 13, 19, and 20 thus become part of VITERBI-SET (e.g., set of unreliable variable nodes), as is illustrated in table 500C of FIG. 5C by the marker "x" being placed in columns 4, 13, 19, and 20. The top row of table 500C indicates the symbol or index (before permutation) of the value that is one of four largest.

In some embodiments, Trellis-Maximization operation can be performed on the elements of VITERBI-SET (e.g., unreliable set) as follows. The symbols for and LLR values assigned to the variable nodes in VITERBI-SET are used to generate a trellis, such as, trellis illustrated in diagram 400 of FIG. 4. For the above example, the trellis includes three sections as there are four elements in VITERBI-SET. The edges or transitions in the trellis (e.g., transitions for symbols "00," "01," "10," and "11") can be assigned weights, such as costs (or measures of likelihood) associated with the normalized LLR vectors corresponding to the variable nodes in VITERBI-SET. For instance, using the normalized LLR vector values from table 500B of FIG. 5B, the following weights can be assigned in the trellis:

| MV | col. 4 | col. 13 | col. 19 | col. 20 |
|---|---|---|---|---|
| transition for "00" | −4.36 | −8.62 | −2.24 | −7.88 |
| transition for "01" | −5.26 | −10.29 | −8.15 | 0.00 |
| transition for "10" | 0.00 | −1.67 | −10.38 | −2.07 |
| transition for "11" | −0.90 | 0.00 | 0.00 | −5.81 |

Figure 6:
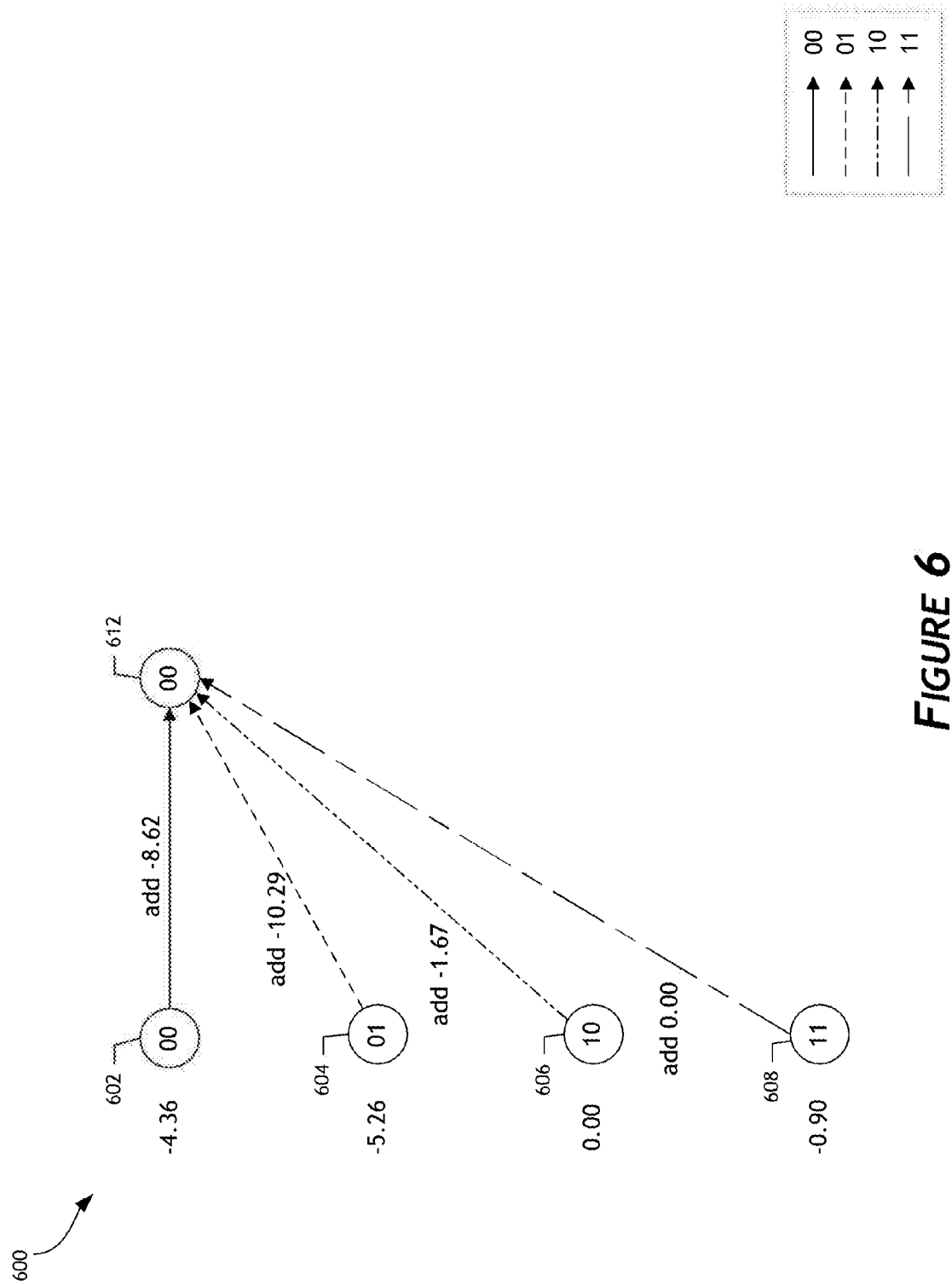
FIG. 6 illustrates Trellis Maximization operation performed by a decoder according to some embodiments of the invention.

FIG. 6 illustrates Trellis Maximization operation performed by a decoder, such as the decoder module 132 or decoder 156, according to some embodiments. The trellis 600 illustrated in FIG. 6 can correspond to the above example (e.g., table (1)). The trellis 600 includes trellis nodes 602, 604, 606, and 608 that correspond to the left row of the above table (1) (e.g., column 4 of table 500B). Each of the nodes is associated with a weight (e.g., LLR value or measure of likelihood that corresponds to that node). For example, node 604 is assigned the weight of −5.26 (e.g., LLR value of −5.26). The trellis 600 illustrates only a part of trellis illustrated in diagram 400 of FIG. 4. The only transitions illustrated in the trellis 600 are transitions from nodes 602, 604, 606, and 608 (which correspond to nodes 402, 404, 406, and 408 in FIG. 4) to node 612 (which corresponds to node 412 in FIG. 4). As is illustrated in FIG. 6, each of the transitions to node 612 is assigned weights from the above table (1). For example, transition between nodes 602 and 612 (e.g., transition corresponding to symbol "00") is assigned weight −8.62, transition between nodes 604 and 612 (e.g., transition corresponding to symbol "01") is assigned weight −10.29, transition between nodes 606 and 612 (e.g., transition corresponding to symbol "10") is assigned weight −1.67, and transition between nodes 608 and 612 (e.g., transition corresponding to symbol "11") is assigned weight 0.00.

Trellis Maximization operation can use the trellis 400 and/or 600 (e.g., traverse the trellis) to determine a smallest or minimum cost to arrive at the last variable node in the trellis. The cost can be based on the path selected for traversing the trellis, and the cost can correspond to a measure of reliability (e.g., minimum cost can be correspond to maximum reliability). In some embodiments, in order to determine the minimum cost, Trellis Maximization operation performs summation of the weights assigned to the starting node with the weight of the transition between the starting node and destination node. For example, the following values can be obtained by performing addition for the transitions between each of nodes 602, 604, 606, and 608 and destination node 612: {−12.98, −15.55, −1.67, −0.90}. Trellis Maximization operation can select the maximum value (e.g., smallest absolute value), which can correspond to the most reliable value, to assign as weight to the destination node 612. Selecting the smallest absolute value can help to avoid overflow and saturation problems on fixed-point platforms. In the above example, value of −0.90 can be assigned as the weight for the destination node 612. In other embodiments, any other suitable liner or non-linear operation can be performed on the weights to determine the weight of the destination node.

For the above example in table (1), the result of the Trellis Maximization operation (e.g. the result of using or traversing the trellis) can be:

$$\text{Trellis} - \text{Max} \begin{pmatrix} -4.36 & -8.62 & -2.24 & -7.88 \\ -5.26 & -10.29 & -8.15 & 0.00 \\ 0.00 & -1.67 & -10.38 & -2.07 \\ -0.90 & 0.00 & 0.00 & -5.81 \end{pmatrix} = \begin{bmatrix} -2.07 \\ -2.96 \\ -0.90 \\ 0.00 \end{bmatrix} \quad (2)$$

Figure 7:
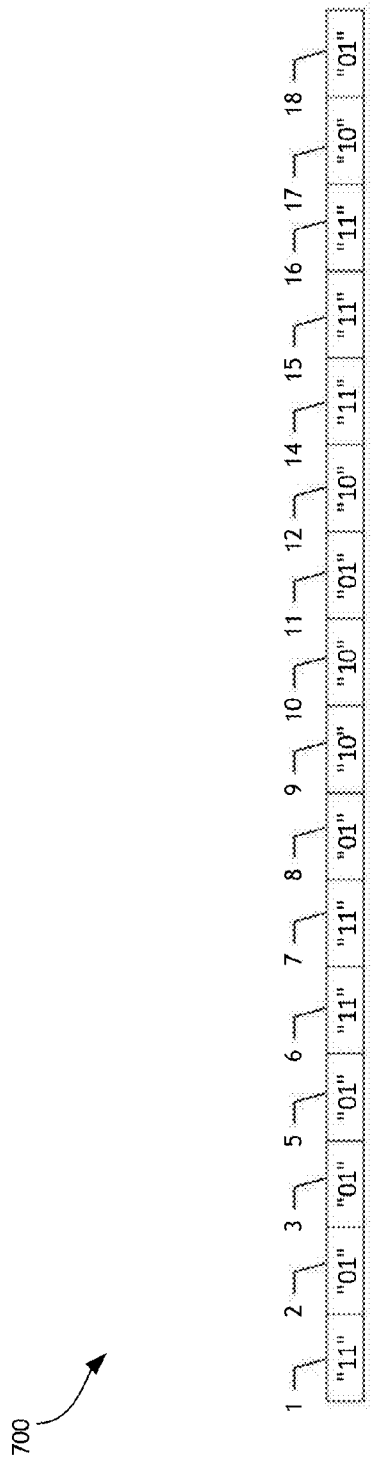
FIG. 7 illustrates a table used during decoding process according to some embodiments of the invention.

In some embodiments, variable nodes in VITERBI-SET-COMPLEMENT (e.g., set of reliable variable nodes) are processed as follows. Indices (or symbols) corresponding to the largest normalized LLR values in VITERBI-SET-COMPLEMENT can be added together. For example, the index corresponding to the largest normalized LLR value for variable node 1 (e.g., column 1 of table 500B) is "11" (corresponding to normalized LLR value of 0.00 in table 500B). As another example, the index corresponding to the largest normalized LLR value for variable node 2 (e.g., column 2 of table 500B) is "01" (corresponding to normalized LLR value of 0.00 in table 500B). Continuing with the rest of variable nodes, the indices illustrated in the table 700 of FIG. 7 can be determined for the elements in VITERBI-SET-COMPLEMENT. Table 700 depicts indices (or symbols) for largest normalized LLR values for variable nodes 1-3, 5-12, and 14-18 (e.g., elements in VITERBI-SET-COMPLEMENT). In some embodiments, GF addition is performed on the indices in table 700. For example, as explained above, GF addition can correspond to performing XOR operation, and the result of GF addition on the indices in table 700 is "00." This index can be stored as maximum element (or ME). In other embodiments, any suitable GF operation or any other operation can be performed on the entire set or subset of indices in table 700.

In some embodiments, messages are generated and sent back to variable nodes that are members of VITERBI-SET-COMPLEMENT (e.g., reliable nodes) as follows. The result of Trellis Maximization operation (vector (2) above) can be modified by the index from table 700 corresponding to a particular variable node. For example, for variable node 1, the index of maximum normalized LLR value is "11." This index can be excluded from modification of the result of Trellis-Maximization operation. The result of Trellis-Maximization operation is a vector of normalized LLR values corresponding to indices (or symbols) {"00," "01," "10," "11"} respectively. For instance, LLR value of −0.90 in the result (vector (2) above) corresponds to index "10." To determine message to send back to variable node 1, the indices of the result of Trellis-Maximization operation (vector (2)) can be modified by GF-adding a combination of all indices corresponding to the variable nodes in VITERBI-SET-COMPLEMENT (table 700) with the exception of the index corresponding to variable node 1 (e.g., index "11") to the indices of the result vector (2). In this example, assuming that GF addition corresponds to XOR operation, the combination of all indices with the exception of the index corresponding to variable node 1 is "11." Performing GF-addition (which, in this example, corresponds to an XOR operation) the modification can result in the index set {"11," "10," "01," "00"} (e.g., XOR("01," "11")= "10"). The result of Trellis-Maximization operation is permuted or shuffled to match the order of indices in the above permuted index set as is illustrated below in vector (3). For example, normalized LLR value of −0.90, which in vector (2) is associated with the index "10," is put in the second slot to match the order of indices in the permuted index set.

$$\begin{bmatrix} 0.00 \\ -0.90 \\ -2.96 \\ -2.07 \end{bmatrix} \quad (3)$$

The following message can be sent back to variable node 1:

$$\alpha_1 \times \begin{bmatrix} 0.00 \\ -0.90 \\ -2.96 \\ -2.07 \end{bmatrix} \quad (4)$$

where $\alpha_1$ is a suitable value that can be selected and optimized in advance. For example, $\alpha_1$ can be a value less than 1, such as 0.6, 0.7, etc., or a value greater than 1. In one embodiment, $\alpha_1$ is 0.65. Similar approach can be used for determining messages to send back to other variable nodes 2, 3, 5-12, and 14-18 in VITERBI-SET-COMPLEMENT.

In some embodiments, messages for sending back to nodes of VITERBI-SET (e.g., unreliable nodes) are determined as follows. Trellis Maximization operation can be performed on the elements of VITERBI-SET with the exception of the element (or node) for which the message is being determined. Excluding such node can result in canceling the effect of the node on the LDPC check node update operation. For example, assume that return message is being determined for variable node 20. Trellis Maximization operation can be performed using LLR values corresponding to variable nodes 4, 13, and 19 as follows:

$$\text{Trellis} - \text{Max} \begin{pmatrix} -4.36 & -8.62 & -2.24 \\ -5.26 & -10.29 & -8.15 \\ 0.00 & -1.67 & -10.38 \\ -0.90 & 0.00 & 0.00 \end{pmatrix} = \begin{bmatrix} -3.13 \\ -2.24 \\ 0.00 \\ -0.90 \end{bmatrix} \quad (5)$$

The result of this operation can be modified (or permuted) by the index determined from processing VITERBI-SET-COMPLEMENT (e.g., the index stored as ME, such as "00" from the above example). This modification can be performed as described above in connection with generating messages to be returned to variable nodes in VITERBI-SET-COMPLEMENT. The following message can be sent back to variable node 20:

$$\alpha_2 \times \begin{bmatrix} -3.13 \\ -2.24 \\ 0.00 \\ -0.90 \end{bmatrix} \quad (6)$$

where $\alpha_2$ is a suitable value that can be selected and optimized in advance. For example, $\alpha_2$ can be a value less than 1, such as 0.6, 0.7, etc., or a value greater than 1. In one embodiment, $\alpha_2$ is the same as $\alpha_1$ (e.g., 0.65). Similar approach can be used for determining messages to send back to other variable nodes 4, 13, and 19 in VITERBI-SET.

Figure 8A:
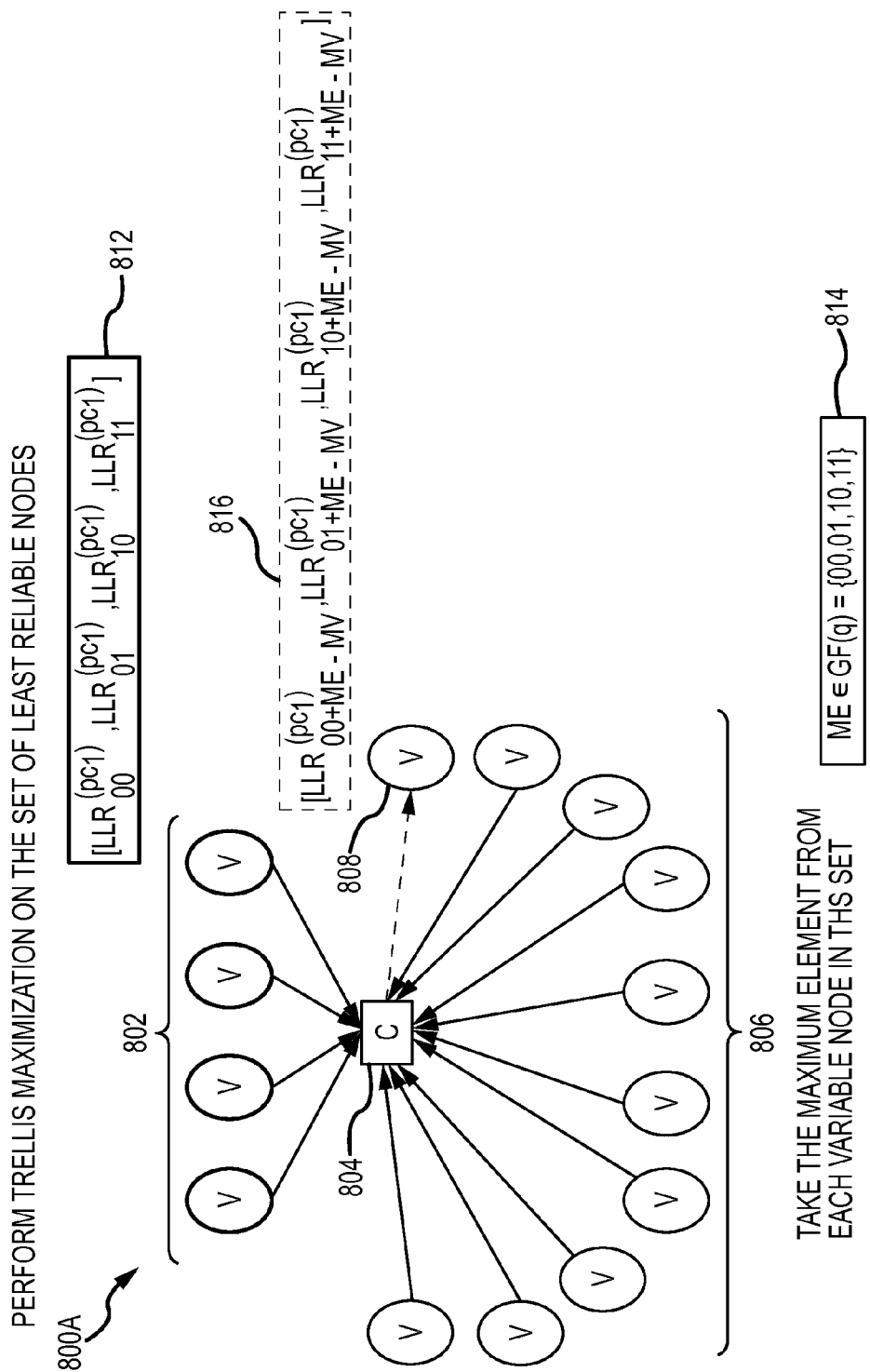
FIGS. 8A and 8B illustrate flow diagrams depicting decoding process that uses Trellis Maximization performed by a decoder according to some embodiments of the invention.
Figure 8B:
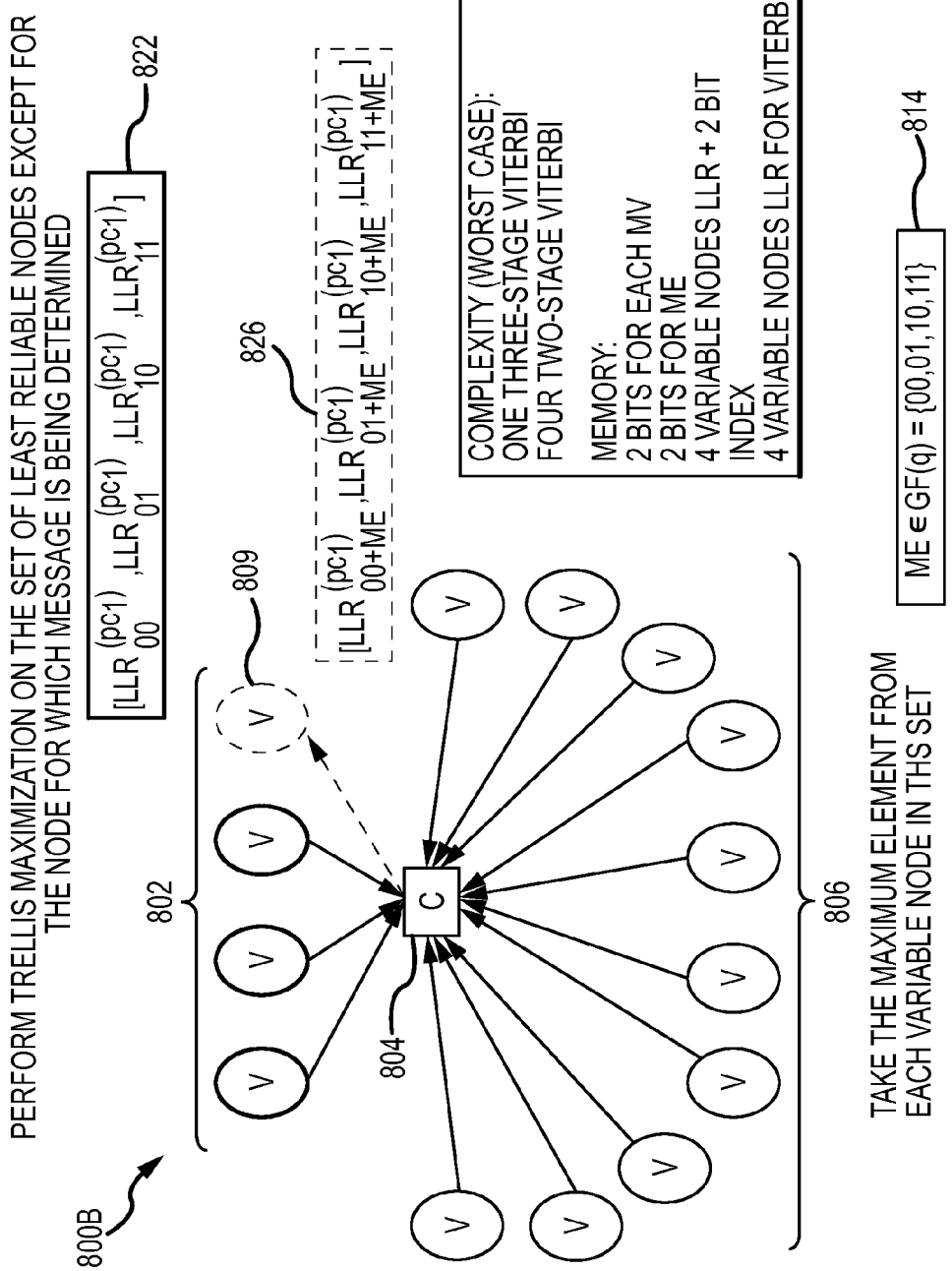

FIGS. 8A and 8B illustrate flow diagrams depicting decoding processes that use Trellis Maximization performed by a decoder, such as the decoder module 132 or decoder 156, according to some embodiments. As in the above example, suppose that the parity check matrix H has m check nodes, n variable nodes where the degree of each check node is twenty (e.g., $d_c$=20) over Galois field of size 4 (e.g., GF(4)). In addition, suppose that VS is set as 4 and VSC is set as 16, which means that four of the least reliable messages from variable nodes are included in VITERBI-SET. Referring to FIGS. 8A and 8B, VITERBI-SET elements (e.g., variable nodes) are depicted as elements 802 and VITERBI-SET-COMPLEMENT elements (e.g., variable nodes) are depicted as elements 806. Check node for which the update is being performed is depicted as node 804. Referring to FIG. 8A, suppose that check node update process 800A determines message to be sent back to variable node 808 in VITERBI-SET-COMPLEMENT (e.g., reliable variable node). As explained above, check node update process 800A can perform Trellis Maximization on VITERBI-SET to determine result vector 812. Check node update process 800A can determine ME index 814 from the elements in VITERBI-SET-COMPLEMENT. Message 816 is sent back from the check node 804 to the variable node 808. As explained above, message 816 is generated by modifying result vector 812 by the ME index 814.

Referring to FIG. 8B, check node update process 800B can determine message to be sent back to variable node 809 in VITERBI-SET (e.g., unreliable variable node). As explained above, check node update process 800B can perform Trellis Maximization on VITERBI-SET elements with the exception of variable node 809. The result of Trellis Maximization is vector 822. Message 826 is sent back from the check node 804 to the variable node 809. As explained above, message 826 is generated by modifying the result vector 826 by the ME index 814.

In some embodiments, as is illustrated in FIG. 8B, worst case aggregate processing complexity of processes 800A and 800B for generating messages to reliable and unreliable nodes, respectively, involves generating and computing results of one three-stage Viterbi trellis and four two-stage Viterbi trellises (e.g., each for the four unreliable nodes in VITERBI-SET). Worst case aggregate memory requirements for performing processes 800A and 800B are as follows: two bits for each index MV in the matrix or table (1) used for Trellis Maximization, two bits for ME index, four variable nodes LLR values for the elements or weights in the matrix (1) used for Trellis Maximization along with two-bit index, and four variable nodes LLR values for Trellis Maximization to determine messages to be returned to unreliable variable nodes. Processing and memory requirements can be greatly reduced as compared to performing non-binary LDPC decoding using Fast Fourier Transform (FFT) approaches. For instance, non-binary LDPC decoding using embodiments disclosed herein is optimized because time and memory intensive operations, such as inverse logarithm computations, inverse hyperbolic tangent computations, and the like, are not necessary and are thus not performed. In fact, disclosed embodiments of non-binary LDPC decoders can be easily implemented in hardware as operations needed for decoding are binary additions, limited precision subtractions, simple multiplications by a factor (which can be performed by bit shifters), and comparisons. In addition, trellis-related processing can be minimized because only a small subset of variable nodes can be marked as unreliable nodes and added to VITERBI-SET.

The foregoing is intended to be illustrative and approaches disclosed herein can be further extended to a Galois field having any suitable (e.g., a Galois field of size eight, sixteen, etc.). In addition, approaches disclosed herein are not limited to use with two-level MLC and can be applicable to one-level SLC or MLC with any suitable number of levels (e.g., eight, sixteen, etc.). Degree of check nodes (e.g., code word length) is not limited to twenty and can be set to be smaller or greater than twenty depending on the application, and number of unreliable nodes in VITERBI-SET is not limited to four and can be set to be smaller of greater than four depending on the application.

Figure 9:
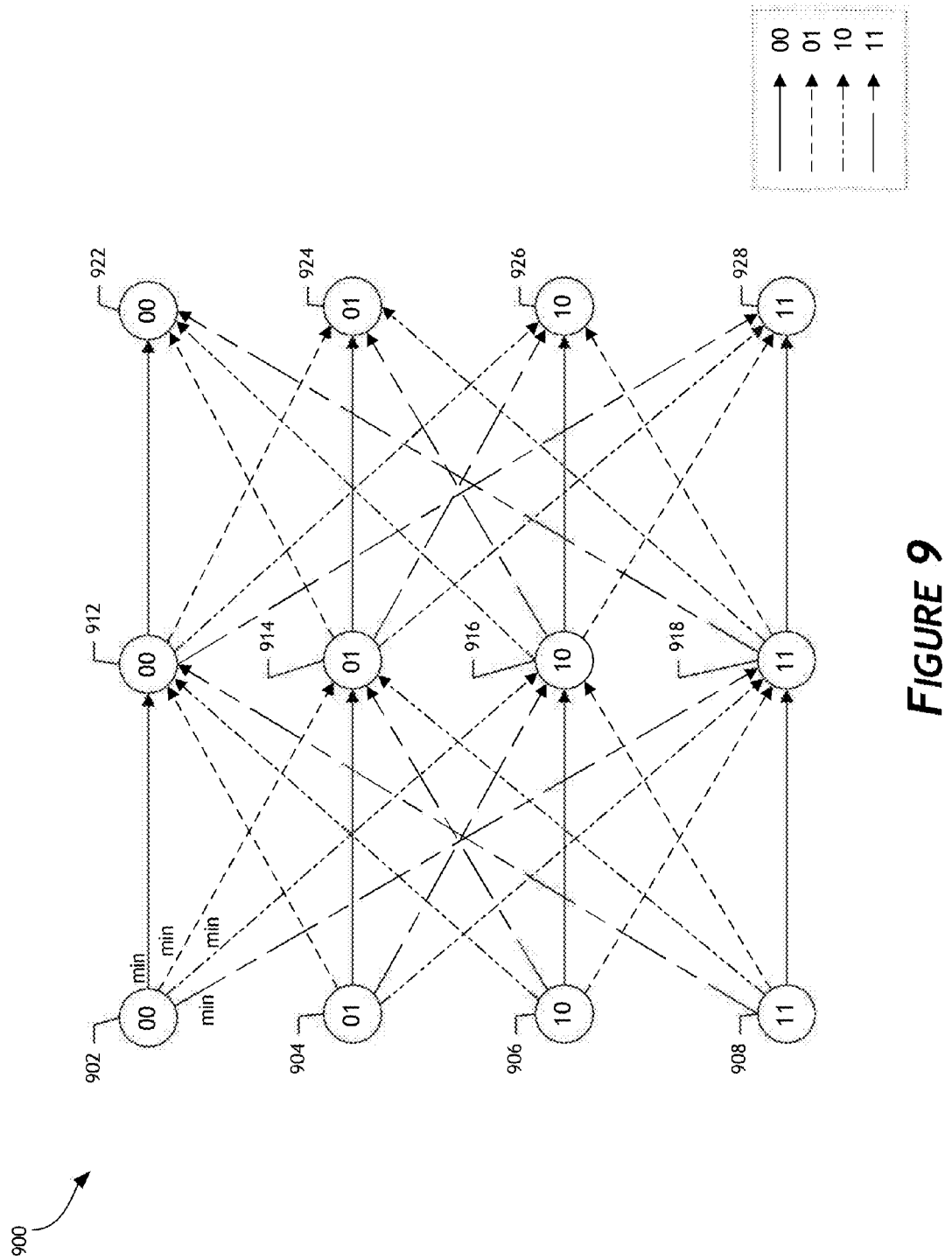
FIG. 9 illustrates a diagram depicting a decoding process that uses Trellis Maximization performed by a decoder according to some embodiments of the invention.

FIG. 9 illustrates a diagram 900 depicting a decoding process that uses Trellis Maximization performed by a decoder, such as the decoder module 132 or decoder 156, according to some embodiments. Trellis illustrated in FIG. 9 is similar to the trellis illustrated in FIG. 4. Nodes 902, 904, 906, and 908 correspond to nodes 402, 404, 406, and 408, nodes 912, 914, 966, and 918 correspond to nodes 412, 414, 416, and 418, and nodes 922, 924, 926, and 928 correspond to nodes 422, 424, 426, and 428. Unlike the process explained above in connection with FIGS. 4 and 6, in FIG. 9 minimum operation can be performed instead of addition. Referring to FIG. 6, rather than performing GF addition using the weights of the nodes and weights of the transitions to determine the minimum cost, the smallest absolute weight (or largest negative value, such as normalized LLR value), which can correspond to the most reliable value, for the transition can be selected and assigned as weight of node 612 using the approach illustrated in FIG. 9. For example, the weight 0.00 corresponding to the transition for symbol "11" from node 608 to node 612 can be selected. Using minimum operation instead of GF addition can reduce computation complexity and can help to avoid overflow and saturation problems on fixed-point platforms. In other embodiments, any suitable operation can be used in connection with performing a check node update.

Figure 10:
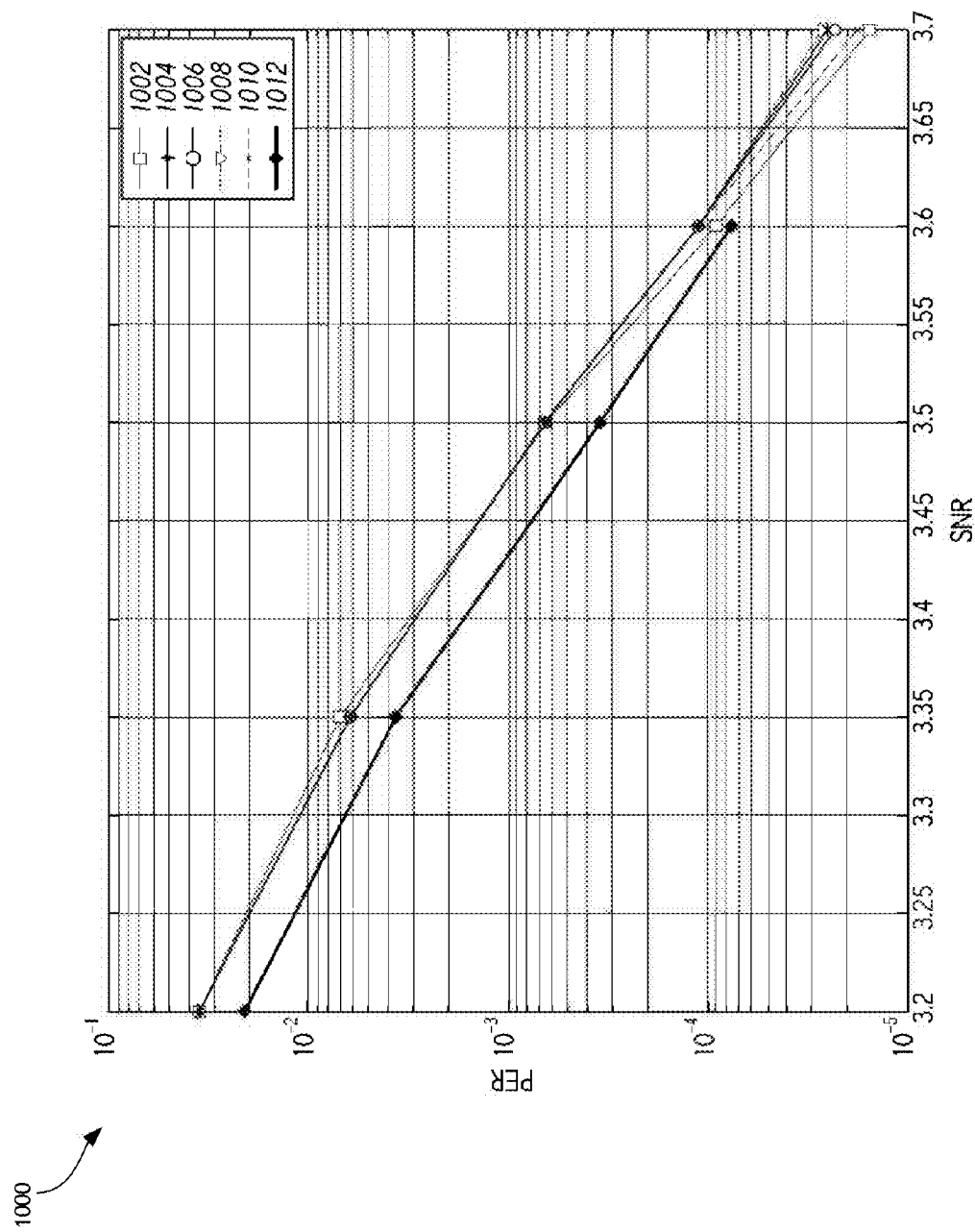
FIGS. 10 and 11 are graphs illustrating comparative performance of various decoding processes according to some embodiments of the invention.

FIG. 10 is a graph 1000 illustrating comparative performance of various decoding processes according to some embodiments. The x-axis correspond to SNR values (increasing from left to right) and y-axis corresponds to error rate metric (decreasing from top to bottom), such as page error rate (PER). Non-binary LDPC decoding can be performed over GF(4). Curve 1012 corresponds to performance of non-binary LDPC FFT-based decoder, and can represent ideal or substantially ideal performance. Due to its complexity, FFT-based decoder is generally not a practical solution for real-time applications. Curves 1002, 1004, 1006, 1008, and 1010 correspond to performance of various embodiments of non-binary LDPC decoders that use summation for performing Trellis Maximization, as explained above in connection with FIG. 6. Curves 1002 through 1010 correspond to performance of non-binary LDPC decoders having 4, 8, 12, 16, and 20 variable nodes respectively in the less reliable set (VITERBI-SET) and 16, 12, 8, 4, and 0 variable nodes respectively in VITERBI-SET-COMPLEMENT with $\alpha_1$ and $\alpha_2$ being 0.6. As is illustrated, performance of non-binary LDPC decoders that use summation for performing Trellis Maximization is comparable to performance of FFT-based non-binary LDPC decoder, particularly in high SNR conditions. As is illustrated, curves 1012 and 1002 through 1010 converge around SNR of 3.6.

Figure 11:
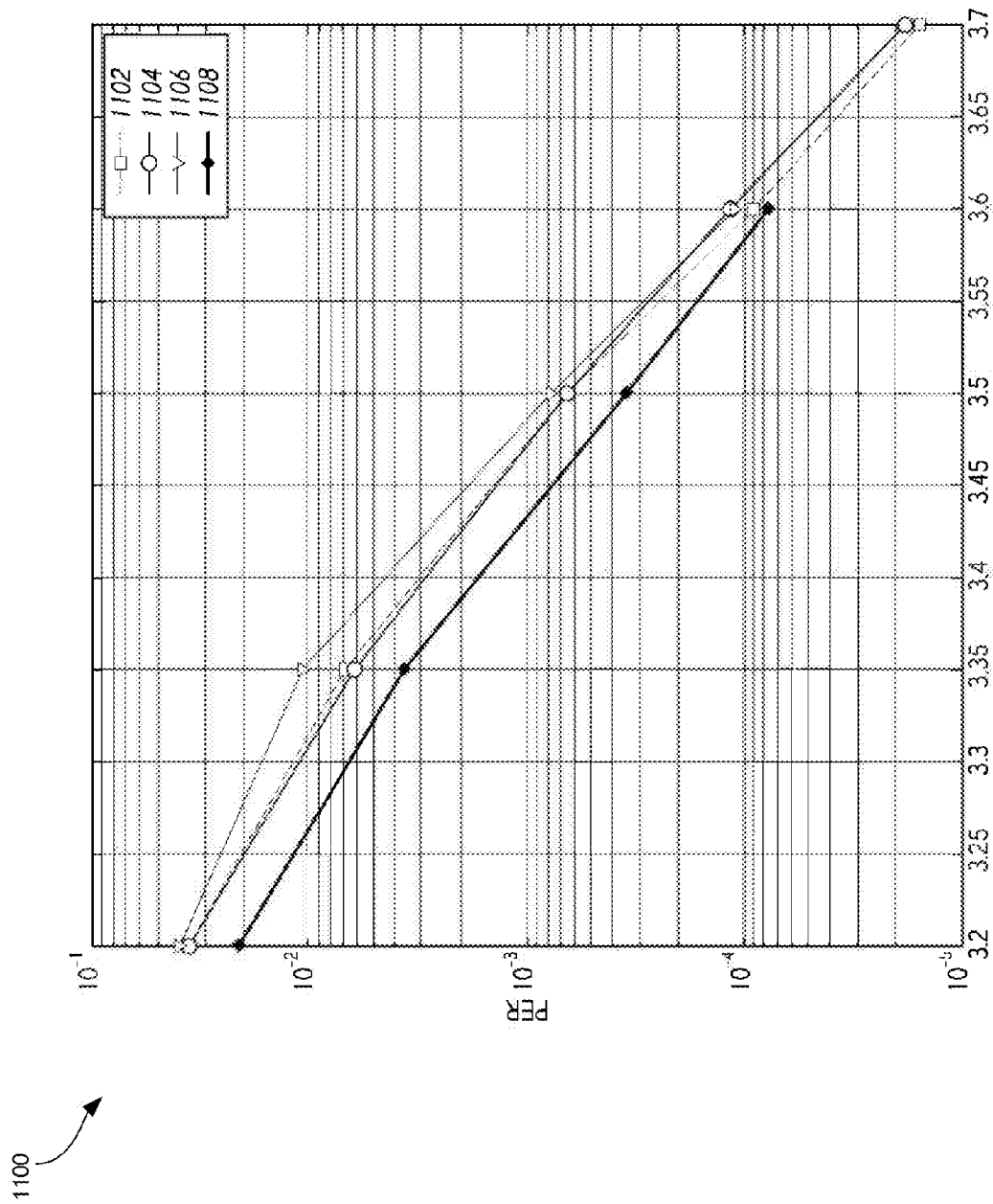

FIG. 11 is a graph 1100 illustrating comparative performance of various decoding processes according to some embodiments. The x-axis correspond to SNR values (increasing from left to right) and y-axis corresponds to error rate metric (decreasing from top to bottom), such as page error rate (PER). Non-binary LDPC decoding can be performed over GF(4). Curve 1108 corresponds to performance of non-binary LDPC FFT-based decoder. Curves 1102 and 1104 correspond to performance of various embodiments of non-binary LDPC decoders that use summation for performing Trellis Maximization, as explained above in connection with FIG. 6. Curves 1102 and 1104 correspond to performance of non-binary LDPC decoders having 4 and 20 variable nodes respectively in the less reliable set (VITERBI-SET) with $\alpha_1$ and $\alpha_2$ being 0.6. Curve 1106 corresponds to performance of an embodiment of non-binary LDPC decoder that uses minimum operation for performing Trellis Maximization, as explained above in connection with FIG. 9. Curve 1106 correspond to performance of non-binary LDPC decoder having 4 variable nodes in unreliable VITERBI-SET and 16 variable nodes in reliable VITERBI-SET-COMPLEMENT with $\alpha_1$ and $\alpha_2$ being 0.7. As is illustrated, performance of non-binary LDPC decoders that use summation and minimum operation for performing Trellis Maximization is comparable to performance of FFT-based non-binary LDPC decoder, particularly in high SNR conditions. As is illustrated, curves 1108, 1102 and 1104, and 1106 converge around SNR of 3.6. Approximations utilized by non-binary LDPC decoders that use minimum operation for performing Trellis Maximization do not negatively affect performance.

Figure 12:
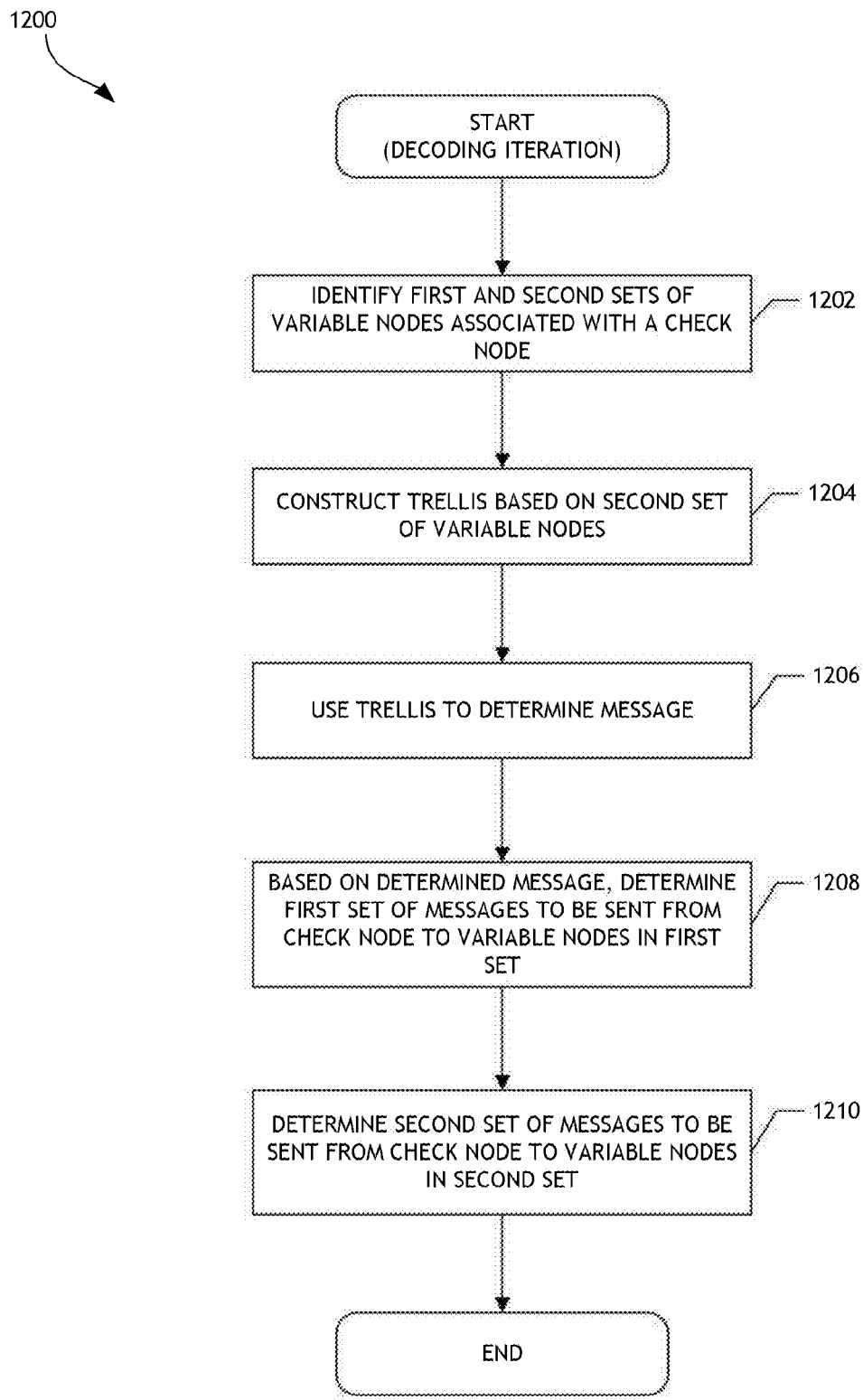
FIG. 12 illustrates a decoding process according to some embodiments of the invention.

FIG. 12 is a flow diagram for a decoding process 1200 according to some embodiments of the invention. The process 1200 can be implemented by the controller 130 (e.g., decoder module 132) or decoder 156. In some embodiments, the process 1200 depicts at least a part of decoding iteration, such as non-binary LDPC decoding iteration. In block 1202, the process 1200 identifies first and second sets of variable nodes from a plurality of variable nodes associated with a check node. For example, the plurality of variable nodes can be associated with the check node in a parity matrix as explained above.

In block 1204, the process 1200 constructs a trellis based on the second set of variable nodes. In block 1206, the process 1200 uses the trellis to determine a message. For example, as explained above, the process 1200 can use the trellis to determine a minimum cost of traversing the trellis from starting to ending variable node. In block 1208, the process 1206 uses the determined message to determine a first set of messages to be sent from the check node to the variable nodes in the first set. The process 1200 can send the first set of messages to the variable nodes in the first set. In block 1210, the process 1200 determines a second set of messages to be sent from the check node to the variable nodes in the second set. The process 1200 can send the second set of messages to the variable nodes in the second set.

CONCLUSION

Disclosed embodiments of non-binary decoders, such as non-binary LDPC decoders, can increase decoding efficiency when compared to traditional approaches for non-binary decoding. Disclosed embodiments can exhibit low memory use, high speed, good performance especially in high SNR environments, good performance even in limited precision implementations, and the like. Disclosed decoders can be easily realized or implemented in hardware by using simple operations, such as binary additions, limited precision subtractions, simple multiplications by a factor (which can be realized using bit shifters), and comparisons. Performance loss due to dividing the set of incoming messages into subsets of reliable and unreliable nodes can be negligible and efficiency can be greatly improved.

OTHER VARIATIONS

Although some embodiments of this disclosure may have been described using data storage systems or controllers for non-volatile storage media as examples, the disclosure can further apply to other environments and applications where data coding is utilized. For example, the disclosure can apply to technologies where a binary or non-binary LDPC codes are used. In one such example, the disclosure can be used for decoding communication channels in telecommunications systems, for instance, such mobile communications, wireless communications, etc. In some embodiments, statistical or probability metrics in addition to or instead of log likelihood ratios can be used.

The actual steps taken in the disclosed processes, such as the processes illustrated in FIGS. 8A and 8B, may differ from those shown in the figures. Additional system components can be utilized, and disclosed system components can be combined or omitted. Depending on the embodiment, certain of the steps described above may be removed, others may be added.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. For example, the various components illustrated in the figures may be implemented as software and firmware on a processor, ASIC/FPGA, or dedicated hardware. Hardware components, such as processors, ASICs, FPGAs, and the like, can have logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A data storage system, comprising:
    a solid-state memory array configured to store a plurality of encoded data units; and
    a controller configured to decode at least one encoded data unit of the plurality of encoded data units by updating a check node of a plurality of check nodes associated with a parity check matrix, the controller configured to update the check node by:
        identifying first and second sets of variable nodes in a plurality of variable nodes associated in the parity check matrix with the check node;
        constructing a trellis based on the second set of variable nodes and using the trellis to determine a message;
        based at least in part on the message, determining a first set of messages to be sent from the check node to the first set of variable nodes; and
        determining a second set of messages to be sent from the check node to each variable node in the second set of variable nodes.

2. The data storage system of claim 1, wherein the controller is further configured to determine a message to be sent from the check node to a variable node in the second set of variable nodes by: 1) constructing an additional trellis based on the second set of variable nodes excluding the variable node for which the message is being determined, 2) using the additional trellis to determine the message to be sent to the variable node.

3. The data storage system of claim 2, wherein the controller is further configured to determine the message to be sent to the variable node by: 1) using the additional trellis to determine an additional resulting message, 2) permuting the additional resulting message by a non-binary symbol, and 3) send the permuted additional resulting message to the variable node.

4. The data storage system of claim 1, wherein the controller is further configured to determine a message to be sent from the check node to a variable node in the first set of variable nodes by: 1) selecting a largest likelihood from a plurality of likelihoods for a plurality of non-binary symbols associated with the variable node and 2) modifying the message with a non-binary symbol corresponding to the selected largest likelihood.

5. The data storage system of claim 1, wherein the controller is further configured to detect and correct errors in the at least one encoded data unit stored in the solid-state memory array in order to determine a non-binary data value from the at least one encoded data unit.

6. The data storage system of claim 1, wherein the controller is further configured to identify the first and second sets of variable nodes by: 1) determining a plurality of reliability metrics for the plurality of variable nodes and 2) assigning the variable nodes to one of the first and second sets based on comparing the plurality of reliability metrics with at least one reliability threshold.

7. An electronic system, comprising
    a decoder configured to decode an encoded data unit received from a data source by updating a check node of a plurality of check nodes associated with a parity check matrix,
    the decoder configured to update the check node by:
        identifying first and second sets of variable nodes in a plurality of variable nodes associated in the parity check matrix with the check node, at least some of the variable nodes in the first set not being part of the second set;
        constructing a trellis based on the second set of variable nodes and using the trellis to determine a resulting message;
        based at least in part on the resulting message, determining a first set of messages to be sent from the check node to each variable node in the first set of variable nodes and sending the determined first set of messages to the first set of variable nodes; and
        determining a second set of messages to be sent from the check node to each variable node in the second set of variable nodes and sending the determined second set of messages to the second set of variable nodes.

8. The electronic system of claim 7, further comprising a solid-state memory array configured to store the plurality of encoded data units, and the plurality of encoded data units comprises data received from a host system.

9. The electronic system of claim 8, wherein the solid-state memory array comprises multi-level cell (MLC) NAND memory configured to store non-binary data.

10. The electronic system of claim 7, wherein the decoder is further configured to construct the trellis by: 1) associating a plurality of transitions between a plurality of trellis nodes with variable nodes in the second set of variable nodes and 2) connecting the plurality of trellis nodes by the plurality of transitions.

11. The electronic system of claim 10, wherein:
    the decoder is further configured to connect a first plurality of trellis nodes corresponding to a first variable node with a second plurality of trellis nodes corresponding to a second variable node by a subset of the plurality of transitions, each transition assigned a corresponding transition likelihood; and the decoder is further configured to: 1) determine a plurality of summations of each transition likelihood associated with the plurality of transitions with a corresponding node likelihood assigned to each of the first plurality of trellis nodes and 2) select a transition corresponding to a maximum cumulative likelihood from the plurality of summations, the selected transition indicative of a most likely transition from the first variable node to the second variable node.

12. The electronic system of claim 10, wherein the decoder is further configured to:
connect a first plurality of trellis nodes corresponding to a first variable node with a second plurality of trellis nodes corresponding to a second variable node by a subset of the plurality of transitions, each transition assigned a corresponding transition likelihood; and
select a transition with a maximum transition likelihood from the plurality of transitions, the selected transition corresponding to a most likely transition from the first variable node to the second variable node.

13. The electronic system of claim 10, wherein the decoder is further configured to associate the plurality of transitions with a plurality of log-likelihood ratios grouped in a plurality of sets of log-likelihood ratios, each set normalized by largest log-likelihood ratio from the set.

14. The electronic system of claim 7, wherein the decoder is further configured to: 1) select a largest likelihood from a plurality of likelihoods for a plurality of non-binary symbols associated with each variable node in the first set of variable nodes and 2) determine a plurality of non-binary symbols corresponding to a plurality of selected largest likelihoods.

15. The electronic system of claim 14, wherein the decoder is further configured to determine the first set of messages to be sent from the check node to each variable node in the first set of variable nodes by permuting the resulting message with the determined plurality of non-binary symbols.

16. The electronic system of claim 14, wherein the decoder is further configured to combine at least some of the plurality of non-binary symbols to determine a combined non-binary symbol and permute the resulting message with the combined non-binary symbol.

17. The electronic system of claim 16, wherein the decoder is further configured to combine the plurality of non-binary symbols by performing Galois field addition on at least some of the plurality of non-binary symbols to determine the combined non-binary symbol.

18. The electronic system of claim 16, wherein the decoder is further configured to determine the second set of messages to be sent from the check node to each variable node in the second set of variable nodes by: 1) for a variable node in the second set of variable nodes, constructing an additional trellis based on the second set of variable nodes excluding the variable node, 2) using the additional trellis to determine an additional resulting message, 3) permuting the additional resulting message by the combined non-binary symbol, and 4) send the permuted additional resulting message from the check node to the variable node.

19. The electronic system of claim 7, wherein the decoder is further configured to perform non-binary low-density parity check (LDPC) decoding in order to correctly detect a non-binary message from the encoded data unit.

20. The electronic system of claim 7, wherein the decoder is further configured to identify the first and second sets of variable nodes by: 1) determining a plurality of reliability metrics for the plurality of variable nodes and 2) assigning the variable nodes to one of the first and second sets based on comparing the plurality of reliability metrics with at least one reliability threshold.

21. The electronic system of claim 7, wherein the decoder is further configured to: 1) identify the first and second sets of variable nodes during performing a decoding iteration and 2) identify third and fourth sets of variable nodes different from the first and second sets of variable nodes during performing a different decoding iteration.

22. A method for decoding data, the method comprising:
decoding at least one encoded data unit received from a data source by updating a check node of a plurality of check nodes associated with a parity check matrix,
wherein updating the check node comprises:
identifying first and second sets of variable nodes in a plurality of variable nodes associated in the parity check matrix with the check node, at least some of the variable nodes in the first set not being part of the second set;
constructing a trellis based on the second set of variable nodes and using the trellis to determine a message;
based at least in part on the message, determining a first set of messages to be sent from the check node to each variable node in the first set of variable nodes and sending the determined first set of messages to the first set of variable nodes; and
determining a second set of messages to be sent from the check node to each variable node in the second set of variable nodes and sending the determined second set of messages to the second set of variable nodes,
wherein the method is performed by a decoder.

23. The method of claim 22, further comprising determining a message to be sent from the check node to a variable node in the second set of variable nodes by: 1) constructing an additional trellis based on the second set of variable nodes excluding the variable node for which the message is being determined, 2) using the additional trellis to determine the message to be sent to the variable node.

24. The method of claim 23, further comprising determining the message to be sent to the variable node by: 1) using the additional trellis to determine an additional resulting message, 2) permuting the additional resulting message by a non-binary symbol, and 3) send the permuted additional resulting message to the variable node.

25. The method of claim 22, further comprising determining a message to be sent from the check node to a variable node in the first set of variable nodes by: 1) selecting a largest likelihood from a plurality of likelihoods for a plurality of non-binary symbols associated with the variable node and 2) modifying the message with a non-binary symbol corresponding to the selected largest likelihood.

26. The method of claim 22, further comprising performing non-binary low-density parity check (LDPC) decoding in order to correctly detect a non-binary message from the at least one encoded data unit.

27. The method of claim 22, further comprising identifying the first and second sets of variable nodes by: 1) determining a plurality of reliability metrics for the plurality of variable nodes and 2) assigning the variable nodes to one of the first and second sets based on comparing the plurality of reliability metrics with at least one reliability threshold.

* * * * *